(12) United States Patent
Ikenoue et al.

(10) Patent No.: US 10,651,049 B2
(45) Date of Patent: May 12, 2020

(54) LASER ANNEALING DEVICE

(71) Applicants: KYUSHU UNIVERSITY, NATIONAL UNIVERSITY CORPORATION, Fukuoka (JP); GIGAPHOTON INC., Tochigi (JP)

(72) Inventors: Hiroshi Ikenoue, Fukuoka (JP); Tomoyuki Ohkubo, Oyama (JP); Osamu Wakabayashi, Oyama (JP)

(73) Assignees: KYUSHU UNIVERSITY, NATIONAL UNIVERSITY CORPORATION, Fukuoka (JP); Gigaphoton Inc., Tochigi (JP)

( * ) Notice: Subject to any disclaimer, the term of this patent is extended or adjusted under 35 U.S.C. 154(b) by 0 days.

(21) Appl. No.: 16/055,325

(22) Filed: Aug. 6, 2018

(65) Prior Publication Data
US 2018/0350622 A1 Dec. 6, 2018

Related U.S. Application Data

(63) Continuation of application No. PCT/JP2016/059339, filed on Mar. 24, 2016.

(51) Int. Cl.
*H01L 21/324* (2006.01)
*B23K 26/03* (2006.01)
(Continued)

(52) U.S. Cl.
CPC .......... *H01L 21/324* (2013.01); *B23K 26/032* (2013.01); *B23K 26/034* (2013.01);
(Continued)

(58) Field of Classification Search
None
See application file for complete search history.

(56) References Cited

U.S. PATENT DOCUMENTS 5,304,357 A 4/1994 Sato et al.
6,806,498 B2 * 10/2004 Taketomi ............ H01L 21/2026
257/64

(Continued)

FOREIGN PATENT DOCUMENTS

JP H4-338631 A 11/1992
JP H6-77155 A 3/1994
(Continued)

OTHER PUBLICATIONS

Notification of Transmittal of Translation of the International Preliminary Report on Patentability (Chapter I) and Translation of Written Opinion of the International Searching Authority; PCT/JP2016/059339; dated Sep. 25, 2018.
(Continued)

*Primary Examiner* — Thien F Tran
(74) *Attorney, Agent, or Firm* — Studebaker & Brackett PC

(57) ABSTRACT

A laser annealing device includes: a CW laser device configured to emit continuous wave laser light caused by continuous oscillation to preheat the amorphous silicon; a pulse laser device configured to emit the pulse laser light toward the preheated amorphous silicon; an optical system configured to guide the continuous wave laser light and the pulse laser light to the amorphous silicon; and a control unit configured to control an irradiation energy density of the continuous wave laser light so as to preheat the amorphous silicon to have a predetermined target temperature less than a melting point thereof, and configured to control at least one of a fluence and a number of pulses of the pulse laser light so as to crystallize the preheated amorphous silicon.

21 Claims, 23 Drawing Sheets

(51) Int. Cl.
*B23K 26/066* (2014.01)
*B23K 26/06* (2014.01)
*B23K 26/08* (2014.01)
*H01L 21/02* (2006.01)
*B23K 26/354* (2014.01)
*H01L 21/268* (2006.01)
*B23K 26/064* (2014.01)
*B23K 26/073* (2006.01)
*H01L 21/263* (2006.01)
*B23K 103/00* (2006.01)
*B23K 101/40* (2006.01)

(52) U.S. Cl.
CPC ........ *B23K 26/064* (2015.10); *B23K 26/0604* (2013.01); *B23K 26/066* (2015.10); *B23K 26/0608* (2013.01); *B23K 26/0643* (2013.01); *B23K 26/0648* (2013.01); *B23K 26/0738* (2013.01); *B23K 26/0861* (2013.01); *B23K 26/354* (2015.10); *H01L 21/02356* (2013.01); *H01L 21/02422* (2013.01); *H01L 21/02488* (2013.01); *H01L 21/02532* (2013.01); *H01L 21/02683* (2013.01); *H01L 21/02686* (2013.01); *H01L 21/02691* (2013.01); *H01L 21/268* (2013.01); *H01L 21/2636* (2013.01); *B23K 2101/40* (2018.08); *B23K 2103/56* (2018.08); *H01L 21/0268* (2013.01); *H01L 21/02678* (2013.01)

(56) References Cited

U.S. PATENT DOCUMENTS

| | | | |
|---|---|---|---|
| 9,666,432 B2* | 5/2017 | Sundaram | H01L 21/268 |
| 2003/0022471 A1 | 1/2003 | Taketomi et al. | |
| 2004/0241923 A1 | 12/2004 | Toida | |
| 2005/0272185 A1 | 12/2005 | Seki et al. | |
| 2008/0087895 A1* | 4/2008 | Han | B23K 26/0613 |
| | | | 257/72 |
| 2009/0227121 A1 | 9/2009 | Matsuno et al. | |
| 2014/0233013 A1* | 8/2014 | Sakimura | G01S 17/95 |
| | | | 356/5.01 |

FOREIGN PATENT DOCUMENTS

| | | |
|---|---|---|
| JP | 2000-12484 A | 1/2000 |
| JP | 2000-68520 A | 3/2000 |
| JP | 2004-349643 A | 12/2004 |
| JP | 2005-347694 A | 12/2005 |
| JP | 2008-98595 A | 4/2008 |
| JP | 2011-233709 A | 11/2011 |
| WO | 2007/015388 A1 | 2/2007 |

OTHER PUBLICATIONS

International Search Report issued in PCT/JP2016/059339; dated Jun. 14, 2016.
An Office Action mailed by the Japanese Patent Office dated Nov. 6, 2019, which corresponds to Japanese Patent Application No. 2018-506697 and is related to U.S. Appl. No. 16/055,325.

* cited by examiner

FIG.2A
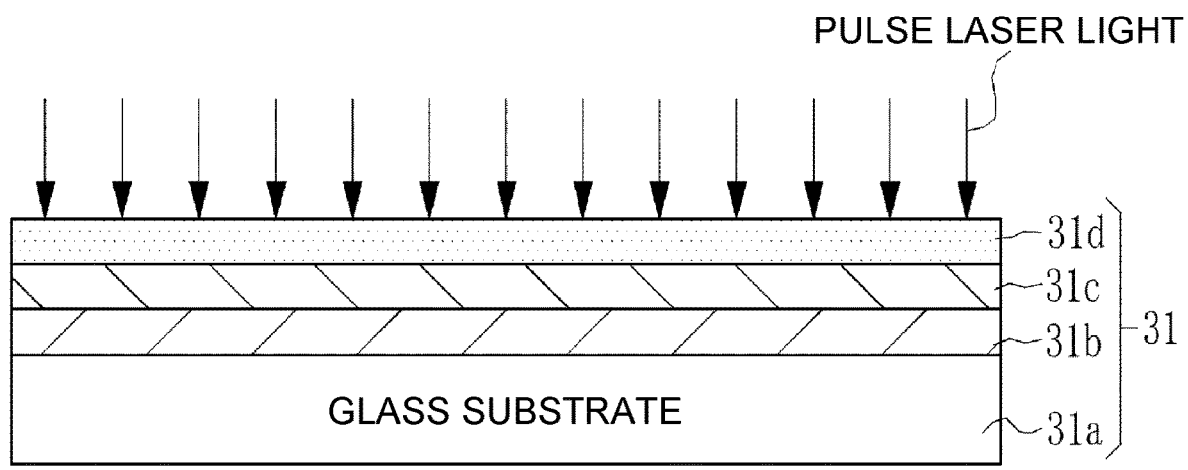
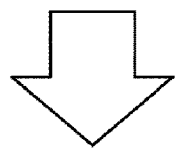
FIG.2B
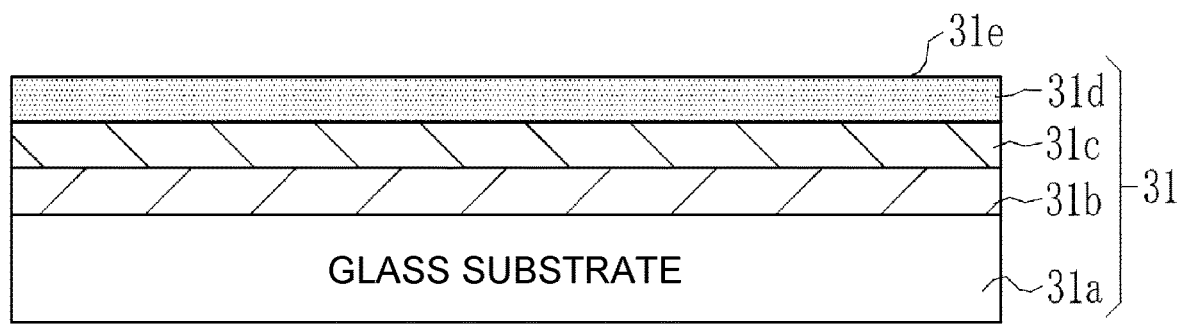

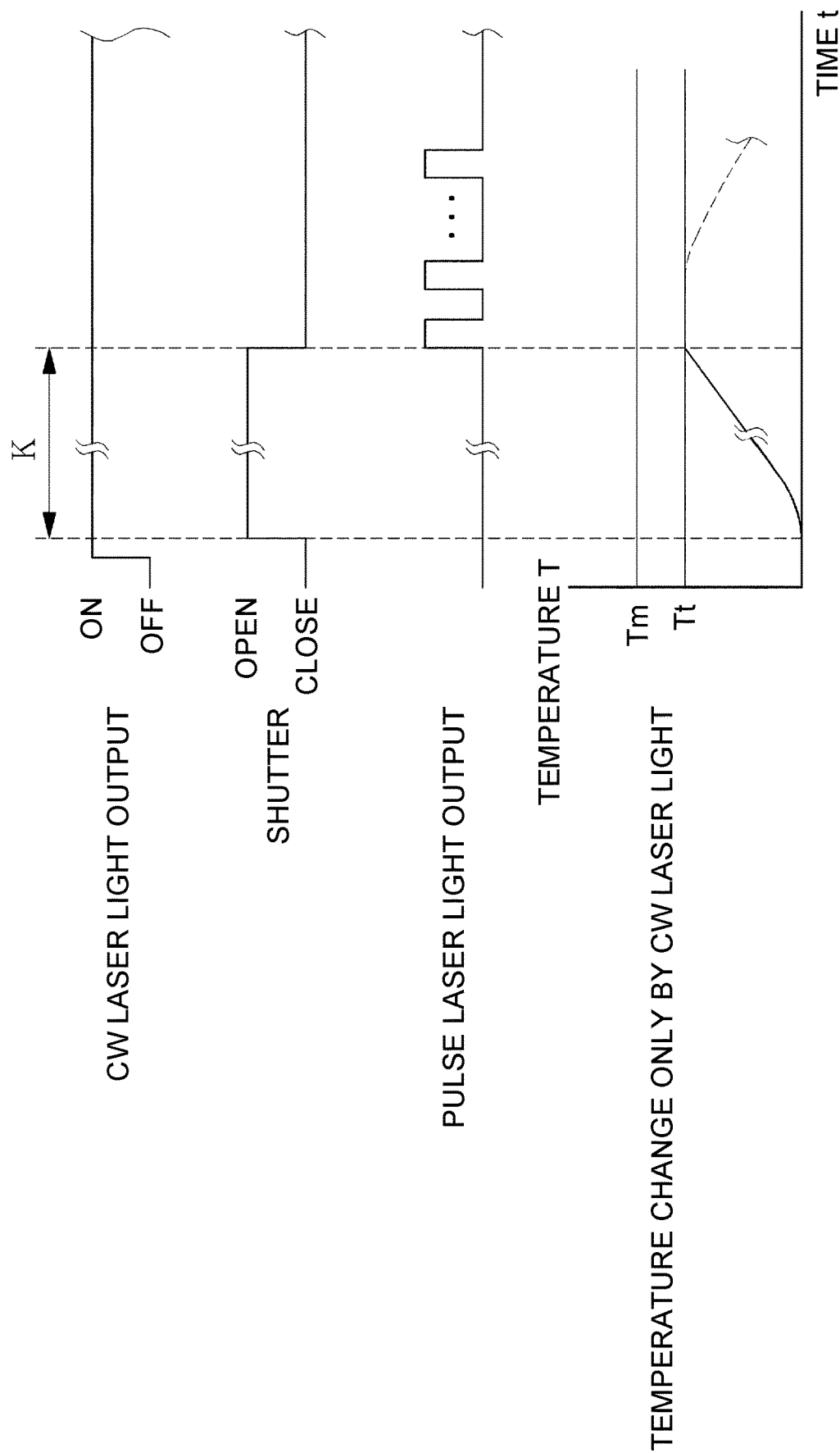

LASER ANNEALING DEVICE

CROSS-REFERENCE TO RELATED APPLICATIONS

The present application is a continuation application of International Application No. PCT/JP2016/059339 filed on Mar. 24, 2016. The content of the application is incorporated herein by reference in its entirety.

BACKGROUND

1. Technical Field

The present disclosure relates to a laser annealing device.

2. Related Art

A TFT substrate that includes a substrate and thin film transistors (TFTs) formed on the substrate is used for a liquid crystal display (LCD). In the liquid crystal display, the TFTs function as switching elements that drive pixels made up of liquid crystal cells.

Typically, the TFT substrate adopts a glass substrate. However, a TFT substrate that adopts a flexible substrate made of resin has also been developed. Amorphous silicon (a-Si) or polysilicon (poly-Si) is used as a TFT material. Polysilicon has a higher carrier mobility by about a two-digit factor than amorphous silicon has. Accordingly, it has been known that use of polysilicon significantly improves the TFT switching characteristics.

Glass substrates and flexible substrates used for TFT substrates have low heat resistance. Accordingly, amorphous silicon that can be formed by a plasma CVD (Chemical Vapor Deposition) method having a low film forming temperature is conventionally adopted. On the contrary, a thermal CVD method having a high film forming temperature is typically required for polysilicon film forming. Accordingly, polysilicon cannot be film-formed directly on a substrate having a low heat resistance. Consequently, a method of forming amorphous silicon on a substrate by the plasma CVD method and subsequently modifying the amorphous silicon to polysilicon by a laser annealing device is used as a method of polysilicon film forming on a substrate having a low heat resistance (see Patent Literatures 1 to 4).

The laser annealing device is a device for annealing, which heats amorphous silicon, by irradiating amorphous silicon formed on a substrate with pulse laser light having an ultraviolet region wavelength, such as excimer pulse laser light. The amorphous silicon is melted and then crystallized and thus becomes polysilicon.

CITATION LIST

Patent Literature

Patent Literature 1: Japanese Patent Application Laid-Open No. 06-077155
Patent Literature 2: International Publication No. WO 2007/015388
Patent Literature 3: Japanese Patent Application Laid-Open No. 2000-012484
Patent Literature 4: Japanese Patent Application Laid-Open No. 2004-349643

SUMMARY

A laser annealing device according to one aspect of the present disclosure anneals amorphous silicon on a substrate by irradiating the amorphous silicon with pulse laser light caused by pulse oscillation. The laser annealing device includes: a CW laser device; a pulse laser device; an optical system; and a control unit. The CW laser device emits continuous wave laser light that is laser light caused by continuous oscillation and preheats the amorphous silicon. The pulse laser device emits the pulse laser light toward the preheated amorphous silicon. The optical system guides the continuous wave laser light and the pulse laser light to the amorphous silicon. The control unit controls an irradiation energy density of the continuous wave laser light so as to preheat the amorphous silicon to have a predetermined target temperature less than a melting point thereof, and controls at least one of a fluence and a number of pulses of the pulse laser light so as to crystallize the preheated amorphous silicon.

BRIEF DESCRIPTION OF THE DRAWINGS

Some embodiments of the present disclosure will be described below as just examples with reference to the accompanying drawings.

FIG. 2A illustrates a state where an amorphous silicon film is irradiated with pulse laser light, and FIG. 2B illustrates a state where the amorphous silicon film is modified to a polysilicon film;

FIG. 9 is a timing chart according to a modification example 2 of the first embodiment;

EMBODIMENTS

<Contents>
1. Overview
2. Laser annealing device according to comparative example
    2.1 Configuration of laser annealing device
    2.2 Operation of laser annealing device
    2.3 Problem
3. Laser annealing device of first embodiment
    3.1 Configuration
    3.2 Operation
    3.3 Working effect
    3.4 Modification example 1
    3.5 Modification example 2
    3.6 Preferable range of central wavelength of CW laser light
    3.7 Preferable range of central wavelength of pulse laser light
4. Laser annealing device of second embodiment
    4.1 Configuration
    4.2 Operation
    4.3 Working effect
    4.4 Modification example
    4.5 Other
5. Laser annealing device of third embodiment
    5.1 Configuration
    5.2 Operation
    5.3 Working effect
    5.4 Modification example 1
    5.5 Modification example 2
    5.6 Modification example 3
6. Details of pulse laser device
7. Fly-eye lens Hereinafter, embodiments of the present disclosure will be described in detail with reference to the drawings. The embodiments described below illustrate some examples of the present disclosure, and do not limit the contents of the present disclosure. Further, all of the configurations and the operations described in the embodiments are not always indispensable as configurations and operations of the present disclosure. It should be noted that the same constituent elements are denoted by the same reference signs, and redundant description is omitted.

1. Overview

The present disclosure relates to a laser annealing device that anneals amorphous silicon on a substrate by irradiating the amorphous silicon with pulse laser light caused by pulse oscillation.

Figure 1:
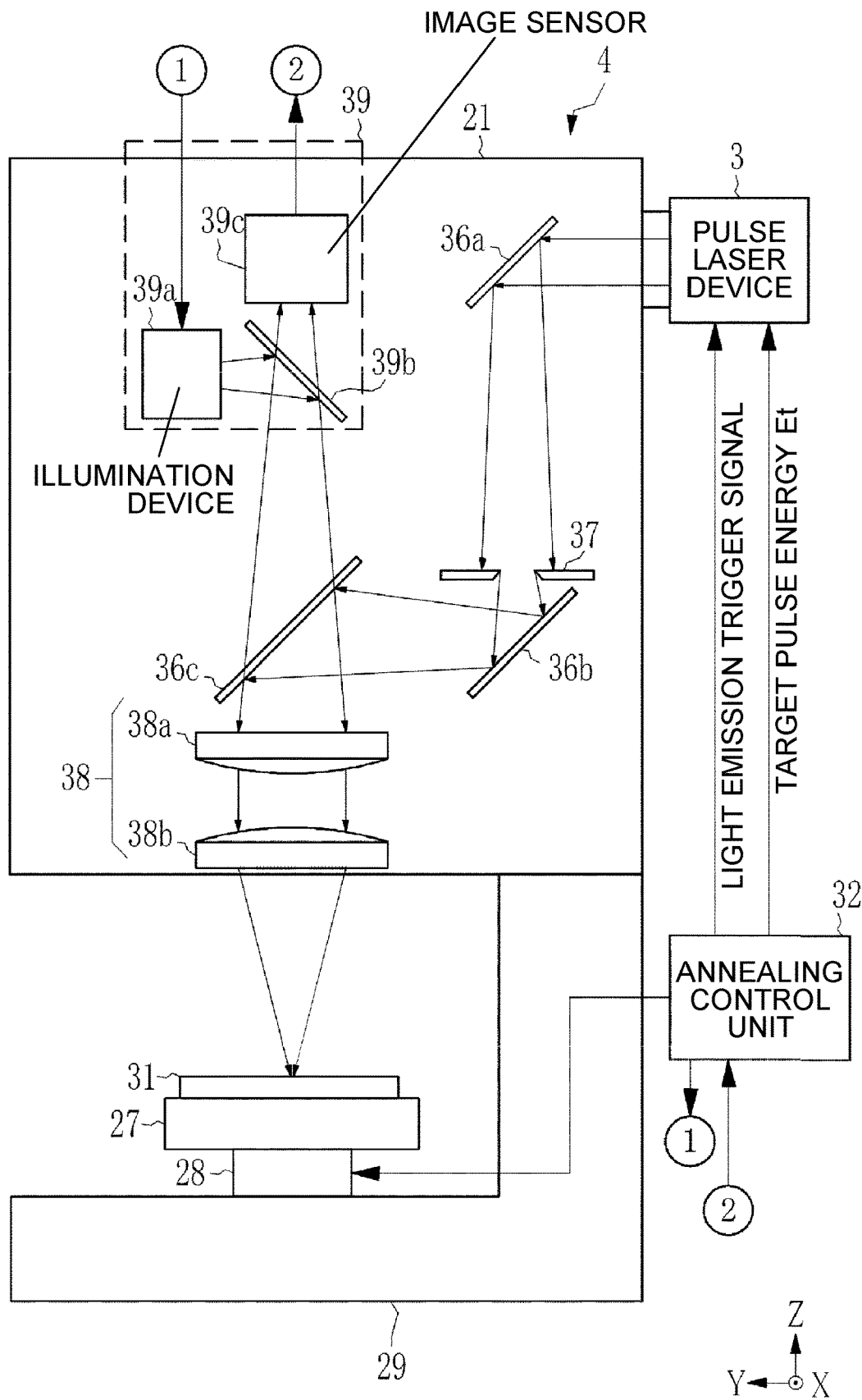
FIG. 1 schematically illustrates a configuration of a laser annealing device according to a comparative example.

2. Laser Annealing Device According to Comparative Example 2.1 Configuration of Laser Annealing Device FIG. 1 schematically illustrates a configuration of a laser annealing device according to a comparative example. The laser annealing device includes a pulse laser device 3, and an annealing device 4. The pulse laser device 3 and the annealing device 4 are connected to each other by an optical tube.

The pulse laser device 3 outputs pulse laser light due to pulse oscillation. The pulse time width of the pulse laser light ranges approximately from 10 ns to 100 ns, for example. In this example, the pulse laser device 3 is an excimer pulse laser device that outputs pulse laser light in an ultraviolet range.

The excimer pulse laser device is an excimer pulse laser device that adopts, for example, ArF, KrF, XeCl or XeF as a laser medium. In a case of an ArF excimer pulse laser device, the pulse laser light has a central wavelength of about 193.4 nm. In a case of an KrF excimer pulse laser device, the pulse laser light has a central wavelength of about 248.4 nm. In a case of an XeCl excimer pulse laser device, the pulse laser light has a central wavelength of about 308 nm. In a case of an XeF excimer pulse laser device, the pulse laser light has a central wavelength of about 351 nm.

Instead of the excimer pulse laser device, a solid-state pulse laser device may be included. The solid-state pulse laser device is a combination of a solid-state pulse laser device that outputs pulse laser light having a wavelength of about 1 μm (1,064 nm), and a wavelength conversion device that applies wavelength conversion to pulse laser light using non-linear crystal. The wavelength conversion device converts the pulse laser light having a wavelength of about 1 μm into the third harmonic wave having a wavelength of 355 nm or the fourth harmonic wave having a wavelength of 226 nm. The pulse laser device with about 1 μm may be a YAG (Yttrium Aluminum Garnet) laser device or a Yb fiber (Ytterbium-Doped Fiber) laser device.

The annealing device 4 includes an optical system 21, a table 27, an XYZ stage 28, a frame 29, and an annealing control unit 32. The optical system 21 and the XYZ stage 28 are fixed to the frame 29.

The table 27 supports an irradiation object 31. The irradiation object 31 is an object to be irradiated with the pulse laser light and be subjected to annealing. In this example, this object is an intermediate product for production of a TFT substrate. The XYZ stage 28 supports the table 27. The XYZ stage 28 can move in an X axis direction, a Y axis direction, and a Z axis direction, and can adjust the position of the irradiation object 31 by adjusting the position of the table 27. The XYZ stage 28 adjusts the position of the irradiation object 31 so that the irradiation object 31 can be irradiated with the pulse laser light emitted from the optical system 21.

The optical system 21 includes, for example, highly reflective mirrors 36a to 36c, a mask 37, a transfer optical system 38, and a monitor device 39. The highly reflective mirrors 36a to 36c reflect pulse laser light in an ultraviolet range, with a high reflectance. The highly reflective mirror 36a reflects the pulse laser light input from the pulse laser device 3, toward the mask 37. The highly reflective mirror 36b reflects the pulse laser light having passed the mask 37, toward the highly reflective mirror 36c. The highly reflective mirror 36c reflects the pulse laser light toward the transfer optical system 38. The highly reflective mirrors 36a to 36c each include a transparent substrate formed of synthetic quartz or calcium fluoride, and a reflection film which is formed on a surface of this substrate and highly reflects the pulse laser light.

The highly reflective mirror 36c is a dichroic mirror that transmits light in an ultraviolet range and transmits visible light. An opening that defines the size and shape of the irradiation region of pulse laser light with which the irradiation object 31 is irradiated, is formed in the mask 37.

The transfer optical system 38 is an optical system that transfers an opening image that is the image of the irradiation region formed by the opening of the mask 37, onto the surface of the irradiation object 31, and transfers the opening image having a uniform optical intensity. The transfer optical system 38 includes, for example, two condenser optical systems 38a and 38b. The transfer optical system 38 may be made up of a single convex lens, or may be an optical system that includes one or more convex lenses and one or more concave lenses. The transfer optical system 38 may be a lens compensated for chromatic aberration with respect to the wavelengths of the visible range and of the pulse laser light in the ultraviolet range.

The monitor device 39 monitors the surface of the irradiation object 31 in order to adjust the position of the irradiation object 31. The monitor device 39 includes, for example, an illumination device 39a, a half mirror 39b, and an image sensor 39c. The illumination device 39a includes a light source that emits visible light. The half mirror 39b includes a substrate that transmits the visible light, and an optical film that is formed on the substrate and reflects about 50% of the visible light while transmitting about 50% of the visible light. The image sensor 39c is a two-dimensional image sensor including light receiving elements that have a reception sensitivity for visible light and are two-dimensionally arranged, and is a CCD (Charge Coupled Device) image sensor or a CMOS (Complementary Metal Oxide Semiconductor) image sensor, for example.

The half mirror 39b is disposed at a position that allows about 50% of visible light incident from the illumination device 39a to be reflected toward the highly reflective mirror 36c. The visible light reflected by the half mirror 39b transmits through the highly reflective mirror 36c and enters the transfer optical system 38. The transfer optical system 38 emits visible light toward the surface of the irradiation object 31. Thereby, the surface of the irradiation object 31 is illuminated with the visible light. The visible light reflected by the surface of the irradiation object 31 transmits through the transfer optical system 38 and the highly reflective mirror 36c and enters the half mirror 39b. The half mirror 39b transmits about 50% of the incident visible light.

The image sensor 39c is disposed at a position that allows an image of the surface of the irradiation object 31 illuminated with the visible light to be formed through the transfer optical system 38, the highly reflective mirror 36c and the half mirror 39b. The image sensor 39c captures the image of the surface of the irradiation object 31. The image sensor 39c outputs the captured image as a monitor image to the annealing control unit 32.

As illustrated in FIG. 2A, the irradiation object 31 includes, for example, a glass substrate 31a, underlying insulating films 31b and 31c formed on the glass substrate 31a, and an amorphous silicon film 31d formed on the underlying insulating films 31b and 31c. The underlying insulating films 31b and 31c are, for example, a silicon nitride film (SiN) and a silicon oxide film ($SiO_2$). The amorphous silicon film 31d is a thin film made of amorphous silicon (a-Si), and is an object to be annealed.

2.2 Operation of Laser Annealing Device

Figure 3:
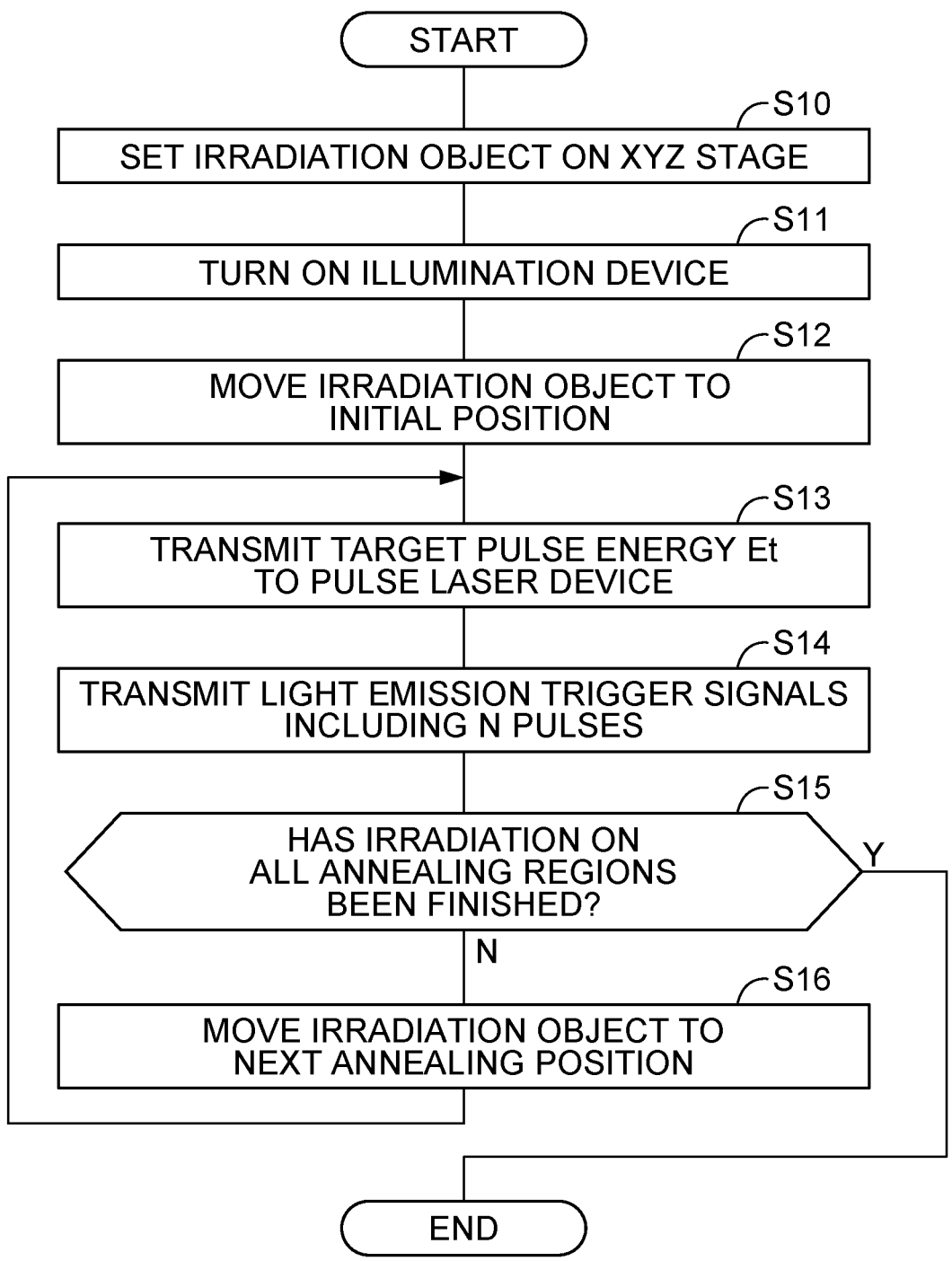
FIG. 3 is a flowchart illustrating procedures in an annealing process in the comparative example.

As illustrated in a flowchart of FIG. 3, in a case of annealing, first, in S10, the irradiation object 31 is set on the XYZ stage 28. In S11, the illumination device 39a of the monitor device 39 is turned on.

In S12, the annealing control unit 32 moves the irradiation object 31 to an initial position. The initial position is a first annealing position, for example. Here, the annealing position is a position at which an annealing region that is a region to be annealed on the irradiation object 31 coincides with an irradiation position allowing the opening image of the mask 37 with the pulse laser light to be formed by the optical system 21. In a case where a plurality of annealing regions reside on the irradiation object 31, a position at which the first annealing region coincides with the irradiation position serves as the first annealing position.

The annealing control unit 32 detects the annealing region on the irradiation object 31 on the basis of the monitor image output by the image sensor 39c. The annealing control unit 32 moves the irradiation object 31 to the initial position serving as the first annealing position, by controlling the XYZ stage 28 on the basis of the detection result to adjust the position of the irradiation object 31 in the X axis direction and the Y axis direction.

The annealing control unit 32 searches for a position in the Z axis direction where the focus is made on the surface of the irradiation object 31, on the basis of the monitor image. The annealing control unit 32 controls the XYZ stage 28 to adjust the position of the irradiation object 31 in the Z axis direction so that the annealing region on the irradiation object 31 can coincide with an image-forming position of the transfer optical system 38.

Next, the annealing control unit 32 controls the fluence and the number of pulses of pulse laser light with which the annealing region on the irradiation object 31 to be irradiated. Here, the fluence is assumed to indicate the irradiation energy density ($mJ/cm^2$) per pulse included in the pulse laser light. In S13, the annealing control unit 32 transmits, to the pulse laser device 3, data on a target pulse energy Et output by the pulse laser light so that the fluence in the annealing region on the surface of the irradiation object 31 can be a predetermined value.

The number of pulses is the number of pulses of pulse laser light with which the same annealing region is irradiated. In S14, the annealing control unit 32 transmits the number of light emission trigger signals according to the number of pulses that is predetermined to be N at a predetermined repetition frequency. Here, N is an integer of one or more.

The pulse laser device 3 outputs the pulse laser light on the basis of the received target pulse energy Et and light emission trigger signals. The pulse laser light output by the pulse laser device 3 is input into the annealing device 4. In the annealing device 4, the pulse laser light passes the highly reflective mirror 36a, the mask 37, the highly reflective mirror 36b and the highly reflective mirror 36c, and enters the transfer optical system 38.

The transfer optical system 38 transfers the mask image of the pulse laser light formed by the mask 37, onto the surface of the irradiation object 31. Thereby, as illustrated in FIG. 2A, the irradiation region according to the mask image on the amorphous silicon film 31d is irradiated with the pulse laser light. The pulse laser light irradiation is performed with the fluence and the set number of pulses according to the target pulse energy Et. When the amorphous silicon film 31d is irradiated with the pulse laser light, the temperature of the amorphous silicon film 31d is increased to a temperature of the melting point thereof Tm or higher and this film is melted. After the amorphous silicon film 31d is melted, this film is crystallized during solidification. Thereby, as illustrated in FIG. 2B, the annealing region, which is on the amorphous silicon film 31d and has been irradiated with the pulse laser light, is modified to the polysilicon film 31e.

After irradiation on one annealing region with the pulse laser light is finished, the annealing control unit 32 determines whether the irradiation on all the annealing regions have been finished or not in S15. If there is any unprocessed annealing region (N in S15), the annealing control unit 32 advances the processing to S16. In S16, the annealing control unit 32 controls the XYZ stage 28 to move the irradiation object 31 to the next annealing position. Subsequently, the procedures in S13 and S14 are repeated. In S15, if the annealing control unit 32 determines that there is no unprocessed annealing region and irradiation on all the annealing regions on the irradiation object 31 with the pulse laser light has been finished (Y in S15), the annealing process for the irradiation object 31 is finished.

2.3 Problem

The polysilicon film 31e includes a plurality of crystals. It is preferable that each crystal have a large particle diameter. For example, this is because in a case where the polysilicon film 31e is used as the TFT channel, the larger the particle diameter of each crystal is, the smaller the number of interfaces between crystals in the channel is, and the scattering of carriers occurring on the interface is reduced. That is, the larger the particle diameter of each crystal of the polysilicon film 31e is, the higher the carrier mobility is, thus increasing the TFT switching characteristics. Increase in the particle diameter of each crystal of the polysilicon requires to increase the temperature of the melted amorphous silicon and increase the solidification time.

In the laser annealing device according to the aforementioned comparative example, in order to increase the particle diameter of each crystal of the polysilicon film 31e, the pulse energy of the pulse laser light to be applied to the amorphous silicon film 31d is required to be increased.

However, in order to increase the pulse energy of the pulse laser light, a high output pulse laser device is required to be adopted as the pulse laser device included in the laser annealing device. There is a problem in that the pulse laser device that achieves a high output by increasing the pulse energy has a large size, a high manufacturing cost, and a high consumption power. For example, in a case of an excimer pulse laser device, in order to increase the pulse energy, a laser chamber 71 (see FIG. 23) described later is required to have a large size. Accordingly, the manufacturing cost is high, and the consumption power is high.

The embodiments described below each includes a CW laser device 41, and an annealing control unit 32A in order to solve the problem. The CW laser device 41 emits CW laser light that is laser light caused by continuous oscillation and preheats the amorphous silicon. The annealing control unit 32A controls the irradiation energy density of the CW laser light so as to preheat the amorphous silicon to have a predetermined target temperature thereof Tt less than the melting point. Further, the annealing control unit 32A controls at least one of the fluence of the pulse laser light and the number of pulses so as to crystallize the preheated amorphous silicon. The annealing control unit 32A corresponds to a control unit in the present disclosure.

3. Laser Annealing Device of First Embodiment

3.1 Configuration

Figure 4:
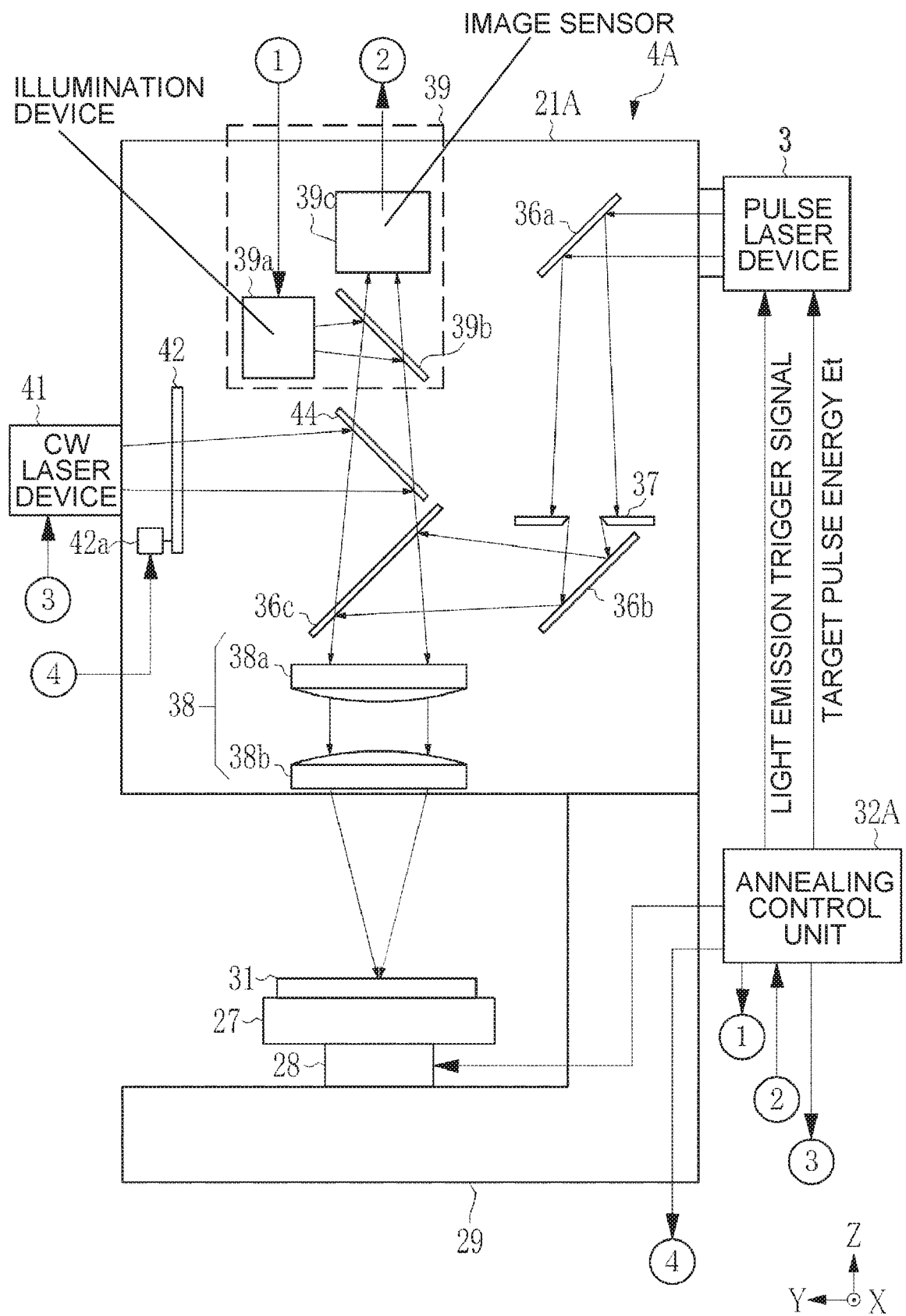
FIG. 4 schematically illustrates a configuration of a laser annealing device according to a first embodiment.

FIG. 4 schematically illustrates a configuration of a laser annealing device according to a first embodiment. The laser annealing device in the first embodiment includes an annealing device 4A instead of the annealing device 4 of the laser annealing device in the comparative example having been described with reference to FIG. 1. The annealing device 4A in the first embodiment includes a CW laser device 41 in addition to the configuration of the annealing device 4. Along with the CW laser device 41 being provided, the annealing device 4A includes the annealing control unit 32A and an optical system 21A instead of the annealing control unit 32 and the optical system 21 in the annealing device 4.

The CW laser device 41 outputs CW (Continuous Wave) laser light, which is laser light caused by continuous oscillation, and is, for example, a semiconductor laser device. The central wavelength of the CW laser light is about 450 nm in this example. The CW laser device 41 irradiates the irradiation object 31 with the CW laser light to preheat the amorphous silicon film 31d of the irradiation object 31 to have the predetermined target temperature Tt, which is lower than and close to the melting point Tm of the amorphous silicon. The melting point Tm of the amorphous silicon is 1,414° C. It is preferable that the target temperature Tt be in a range of 1,300° C.≤Tt≤1,414° C.

The optical system 21A includes a shutter 42 and a highly reflective mirror 44 in addition to the configuration of the optical system 21 in the comparative example illustrated in FIG. 1. The highly reflective mirror 44 is a dichroic mirror coated with a film that reflects light having a central wavelength of about 450 nm with a high reflectance toward the transfer optical system 38, while transmitting visible light other than the reflected light with a high transmittance. The pulse laser light also enters the transfer optical system 38.

The highly reflective mirror 44 couples the irradiation optical path of the CW laser light and the optical path of the visible light, by reflecting the CW laser light toward the transfer optical system 38. Further, the highly reflective mirror 36c couples the irradiation optical path of the CW laser light with the irradiation optical path of the pulse laser light. The highly reflective mirror 44 and the highly reflective mirror 36c correspond to an optical system that couples the irradiation optical path in the present disclosure. Here, coupling means combination of two or more optical paths to form a substantially identical optical path. The optical system 21A guides the CW laser light and the pulse laser light onto the amorphous silicon film 31d of the irradiation object 31 through the coupled irradiation optical path. The optical system 21A is configured so that the CW laser light irradiation region on the amorphous silicon film 31d can include the entire region of the irradiation region of the pulse laser light.

The shutter 42 is disposed on the optical path of the CW laser light between the CW laser device 41 and the highly reflective mirror 44. The shutter 42 is driven by an actuator 42a to be opened and closed. Opening and closing of the shutter 42 switches the CW laser light between emission and non-emission.

The annealing control unit 32A not only has the function of the annealing control unit 32 illustrated in FIG. 1 but also controls the CW laser device 41 and the shutter 42.

3.2 Operation

Figure 5:
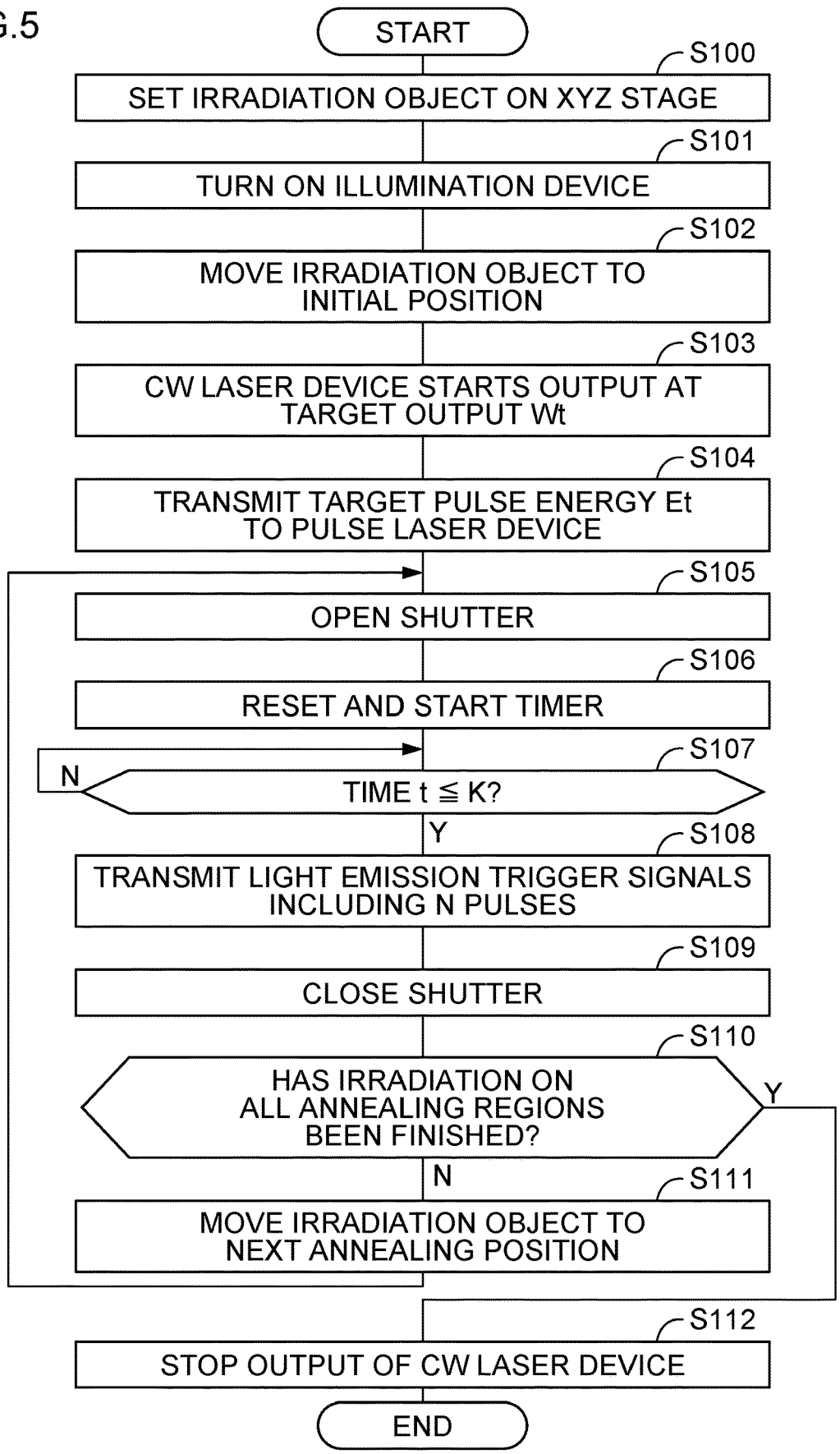
FIG. 5 is a flowchart illustrating procedures in an annealing process in the first embodiment.
Figure 6:
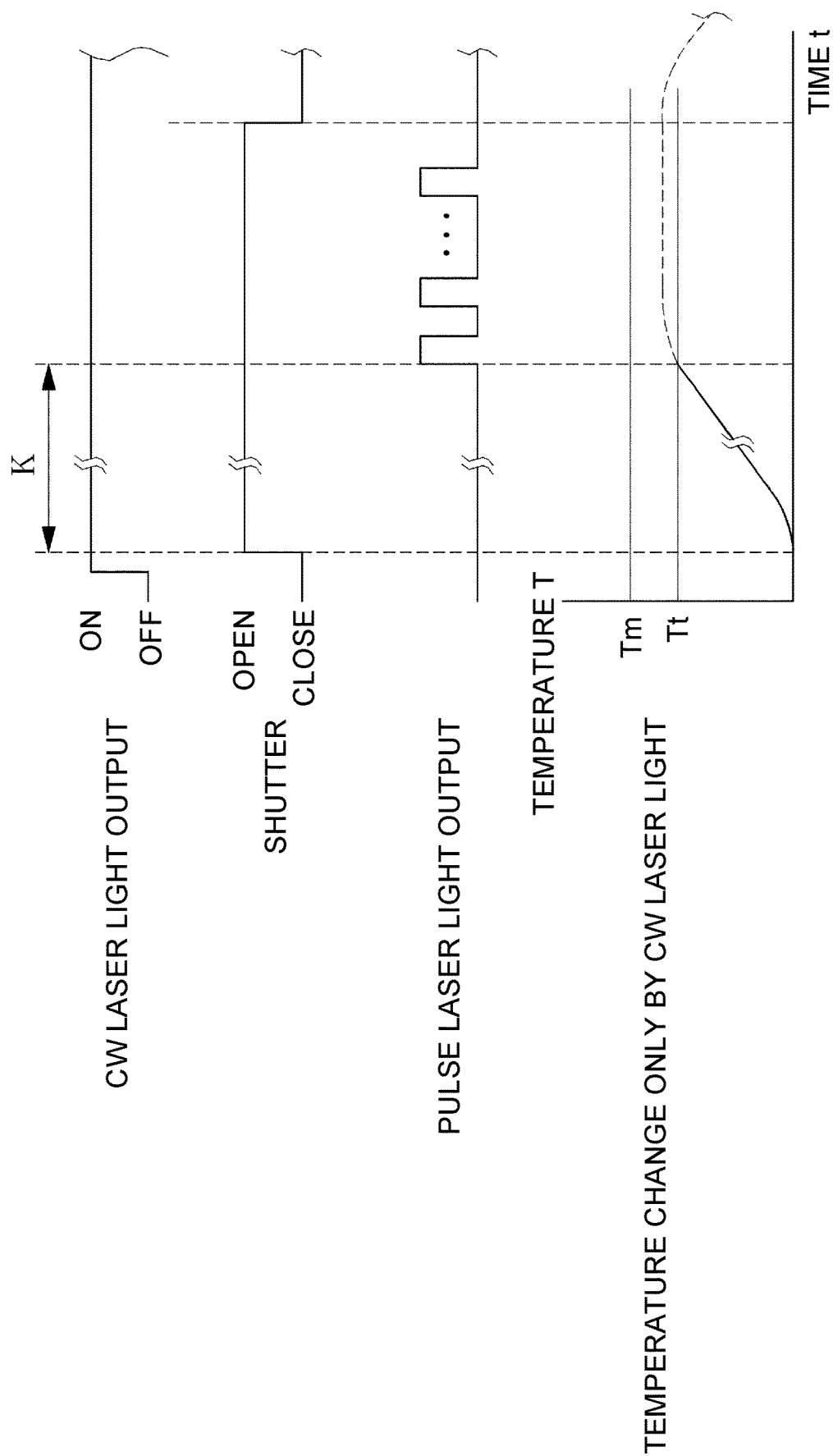
FIG. 6 is a timing chart illustrating temporary changes in output states of CW laser light and pulse laser light and in a temperature of a surface of an irradiation object only due to CW laser light.

Referring to FIGS. 5 and 6, the operation of the first embodiment is described. FIG. 5 is a flowchart illustrating procedures in an annealing process in the first embodiment. FIG. 6 is a timing chart illustrating temporary changes in output states of CW laser light and pulse laser light and in the temperature of the surface of the irradiation object 31 only due to the CW laser light.

As illustrated in FIG. 5, also in the first embodiment, the procedures of setting the irradiation object 31 on the XYZ stage 28 (S100), turning on the illumination device 39a (S101), and moving the irradiation object 31 to the initial position (S102) are respectively analogous to S10 to S12 of the flowchart in the comparative example illustrated in FIG. 3.

In S103, the annealing control unit 32A transmits the value of a target output Wt and a start instruction to the CW laser device 41 so as to start CW laser light output at the target output Wt. Upon receipt of the start instruction, the CW laser device 41 starts the output of the CW laser light at the target output Wt.

As illustrated in the timing chart of FIG. 6, in an initial state, the shutter 42 is closed. Accordingly, the CW laser light is blocked by the shutter 42 while the shutter 42 is closed, even if the output of the CW laser light is turned on. Consequently, the CW laser light does not enter the highly reflective mirror 44, and the irradiation object 31 is not irradiated with this light.

In S104, the annealing control unit 32A transmits the target pulse energy Et to the pulse laser device 3. In this stage, the light emission trigger signal is not transmitted. Consequently, the pulse laser light output is not started.

Figure 7A:
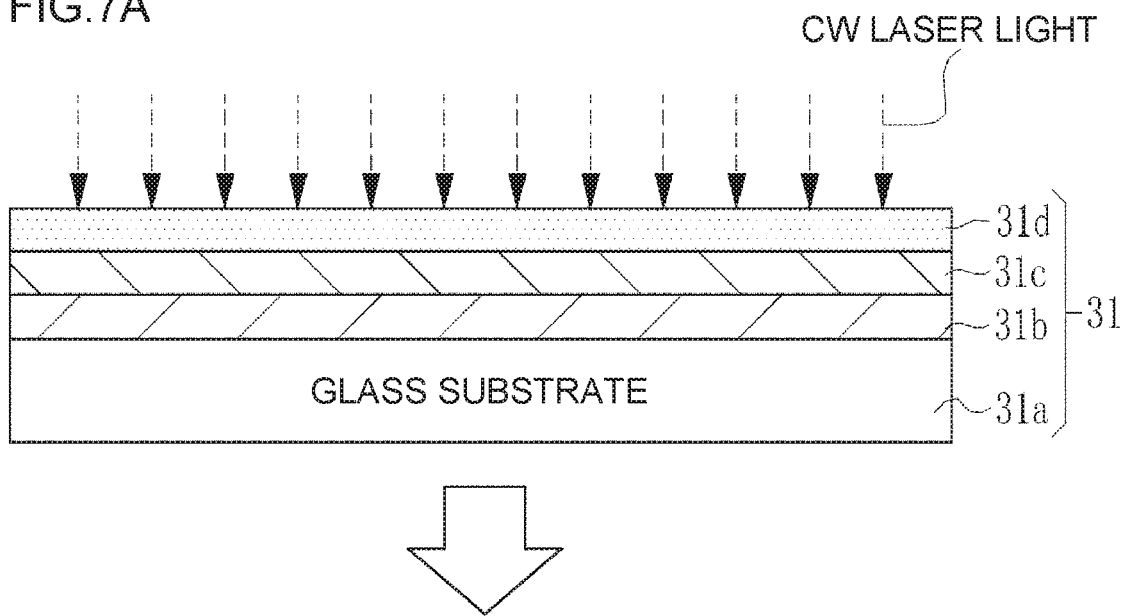
FIG. 7A illustrates a state where an amorphous silicon film is irradiated with CW laser light to preheat the amorphous silicon film.

In S105, the annealing control unit 32A transmits an instruction for opening the shutter 42, to the actuator 42a. When the shutter 42 is opened, the CW laser light enters the transfer optical system 38 through the highly reflective mirror 44, and starts irradiation of the irradiation object 31. As illustrated in FIG. 7A, preheating of the amorphous silicon film 31d is started by irradiation with the CW laser light.

In S106, when the shutter 42 is opened, the annealing control unit 32A resets and starts a timer. In S107, the annealing control unit 32A measures the elapsed time t using the timer, and determines whether the measured time t reaches a predetermined time K or not.

Here, the predetermined time K is a time from the start of irradiation to the temperature T of the amorphous silicon film 31d reaching the target temperature Tt in a case where the amorphous silicon film 31d of the irradiation object 31 is irradiated with the CW laser light at the target output Wt. The predetermined time K is preliminarily measured, and the measured value is set in the annealing control unit 32A.

As described later, in this example, the irradiation with the CW laser light is continued until the irradiation with the pulse laser light is finished. In this case, the predetermined time K may be obtained as follows. First, it is performed to obtain an irradiation time K1 of the CW laser light that allows the temperature T to be higher than the target temperature Tt and slightly lower than the melting point Tm at a time point when the irradiation with the CW laser light is finished. A value obtained by subtracting an irradiation time K2 of the pulse laser light from the irradiation time K1, i.e., "K1-K2" is regarded as the predetermined time K.

As illustrated in FIG. 6, when the shutter 42 is opened to start irradiation with the CW laser light, the temperature of the amorphous silicon film 31d starts to increase toward the target temperature Tt. When the time t reaches the predetermined time K, the temperature T of the amorphous silicon film 31d reaches the target temperature Tt.

If it is determined that the time t reaches the predetermined time K in S107 (Y in S107), the annealing control unit 32A advances the processing to S108 and transmits N light emission trigger signals at a predetermined repetition frequency to the pulse laser device 3. Thereby, as illustrated in FIG. 6, the pulse laser light including N pulses is output at the predetermined repetition frequency.

In the timing chart of FIG. 6, the ratio of the irradiation period of the CW laser light and the irradiation period of the pulse laser light is provided for the sake of convenience. In actuality, the irradiation period of the CW laser light is on the order of several seconds (s), while the pulse time width of the pulse laser light ranges from about 10 ns to about 100 ns as described above. The irradiation period of the pulse laser light is significantly short in comparison with the irradiation period of the CW laser light.

The amorphous silicon film 31d of the irradiation object 31 is irradiated with the pulse laser light at the fluence according to the target pulse energy Et. The irradiation with the pulse laser light increases the temperature of the amorphous silicon film 31d to the melting point Tm or higher, and this film 31d is melted. In FIG. 6, the temperature change only due to the CW laser light maintains the temperature to be lower than the melting point Tm as indicated by a broken line during irradiation with the pulse laser light. The temperature change illustrated in FIG. 6 is change in the temperature of the amorphous silicon film 31d assuming that irradiation is performed only with the CW laser light. If irradiation is performed with the pulse laser light, it is a matter of course that the temperature T of the amorphous silicon film 31d exceeds the melting point Tm.

After the pulse laser light output is finished in S108, the annealing control unit 32A advances the processing to S109, and transmits an instruction for closing the shutter 42 to the actuator 42a, thus closing the shutter 42. As illustrated in FIG. 6, when the shutter 42 is closed, the CW laser light is blocked by the shutter. Accordingly, the irradiation with the CW laser light is finished.

After the irradiation with the pulse laser light is finished, the temperature of the amorphous silicon film 31d decreases to a temperature less than the melting point Tm, and this film 31d is resolidified. After the irradiation with the CW laser light is finished subsequent to the completion of the irradiation with the pulse laser light, the temperature T of the amorphous silicon film 31d further decreases and solidification advances. The solidification of the amorphous silicon film 31d advances in the resolidification process after melting, and the amorphous silicon film 31d is modified to the polysilicon film 31e.

After S109, the annealing control unit 32A executes S110 and S111 that are respectively analogous to S15 and S16 in the comparative example illustrated in FIG. 3. In S110, if the annealing control unit 32A determines that the next unprocessed annealing region is present (N in S110), the processing proceeds to S111, and this unit 32A moves the irradiation object 31 to the next annealing position. At the next annealing position, the procedures from S105 to S109 are repeated. On the other hand, if the annealing control unit 32 determines that there is no unprocessed annealing region and irradiation on all the annealing regions on the irradiation object 31 with the pulse laser light has been finished (Y in S110), the annealing process for the irradiation object 31 is finished. If the annealing process has been finished, the annealing control unit 32A advances the processing to S112, and turns off the CW laser device 41 to stop output of the CW laser light.

3.3 Working Effect

Figure 7B:
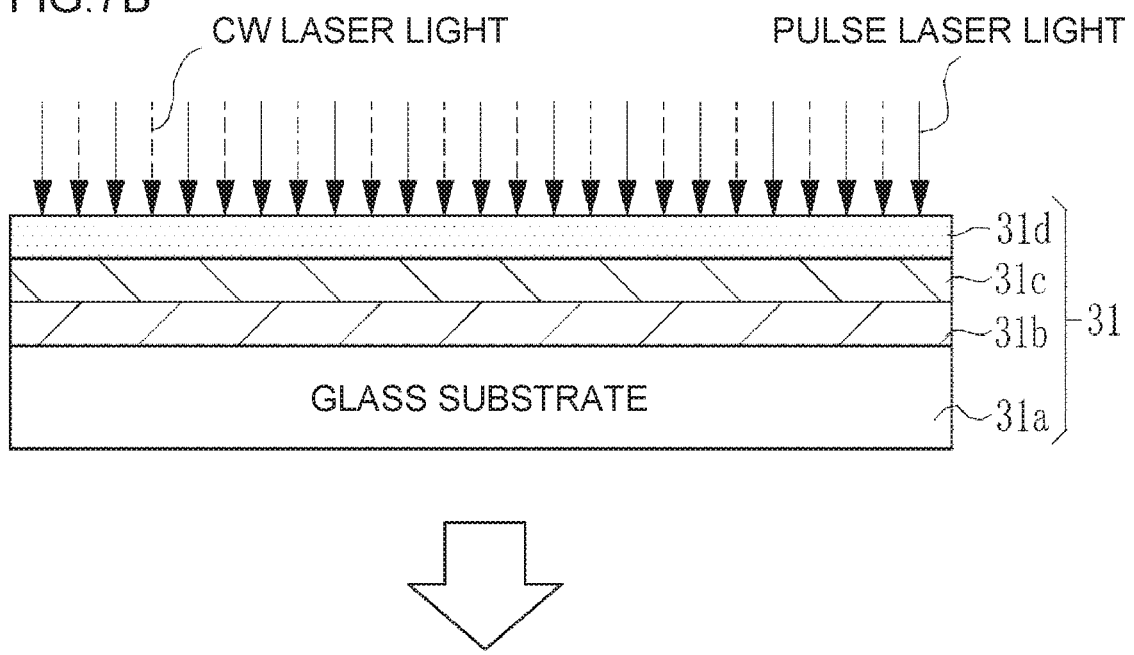
FIG. 7B illustrates a state where the amorphous silicon film is irradiated with CW laser light and pulse laser light.
Figure 7C:
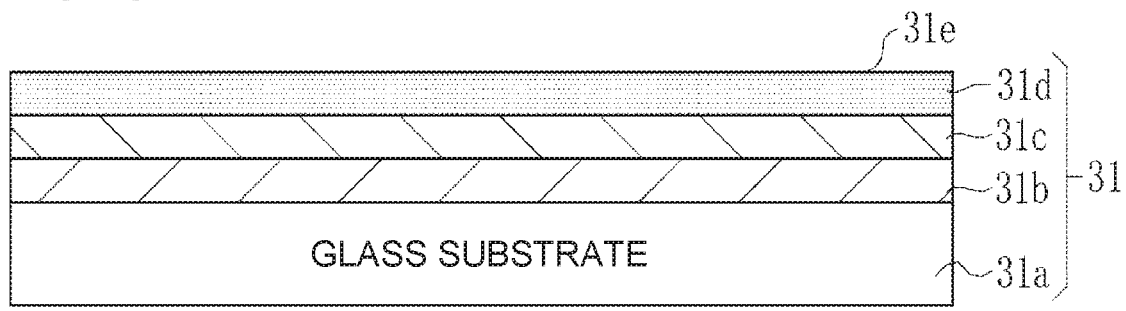
FIG. 7C illustrates a state where the amorphous silicon film is modified to the polysilicon film.

FIGS. 7A and 7B are a diagrams illustrating the procedures of irradiation with the CW laser light and the pulse laser light in the first embodiment. In the first embodiment, as illustrated in FIG. 7A, the amorphous silicon film 31d is irradiated with the CW laser light before being irradiated with the pulse laser light. Thereby, the amorphous silicon film 31d is preheated so that the temperature T becomes the target temperature Tt. Next, as illustrated in FIG. 7B, the preheated amorphous silicon film 31d is irradiated with the pulse laser light. During irradiation with the pulse laser light, the irradiation with the CW laser light is continued. As illustrated in FIG. 7C, the annealing regions, which are on the amorphous silicon film 31d and have been irradiated with the pulse laser light, are modified to the polysilicon film 31e.

The irradiation with the CW laser light preheats the amorphous silicon film 31d to have the target temperature Tt, which is less than and close to the melting point Tm. The amorphous silicon film 31d is irradiated with the pulse laser light in the preheated state. Accordingly, the first embodiment can reduce the output required to melt the amorphous silicon film 31d using the pulse laser light, by an amount due to the preheating by the CW laser light, in comparison with the case of irradiation only with the pulse laser light in the comparative example. Thereby, increase in the output of the pulse laser device 3 can be suppressed. Consequently, increase in the manufacturing cost of the pulse laser device 3 and increase in the consumption power can also be suppressed.

Even in a case where the pulse laser light has the same pulse energy as the comparative example does, the preheating by the CW laser light increases the temperature of the melted amorphous silicon film 31d, and increases the solidification time. Accordingly, the particle diameter of each crystal modified to that of the polysilicon film 31e can be increased.

The CW laser light irradiation regions include all the pulse laser light irradiation regions. Consequently, all the annealing regions to be irradiated with the pulse laser light can be preheated. The optical system 21A includes the optical system that couples the irradiation optical paths of the CW laser light and the pulse laser light to each other. Consequently, the optical system can be reduced in size and be simplified.

Figure 8:
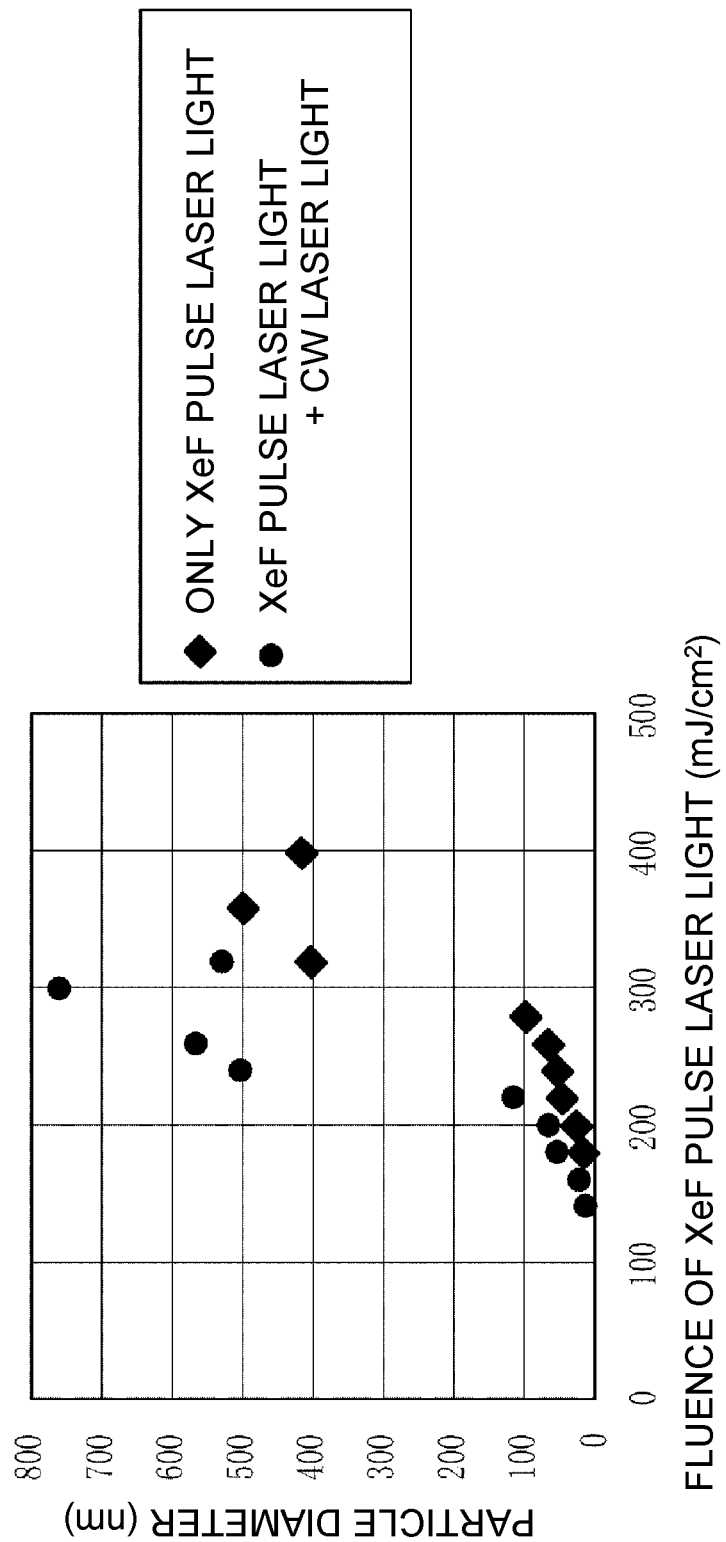
FIG. 8 is a graph illustrating a relationship between a fluence of the pulse laser light and sizes of diameters of particles crystallized by annealing.

FIG. 8 is a graph illustrating the relationship between the fluence (mJ/cm$^2$) of pulse laser light and the sizes of the diameters (nm) of particles crystallized by annealing. The size of the particle diameter is the average value of the particle diameters of a plurality of crystallized crystals. A graph plotted with rhombuses is a graph in a case of annealing by irradiation only with the pulse laser light, and corresponds to the comparative example. A graph plotted with circles is a graph in a case of preheating with the CW laser light and subsequent annealing by irradiation with the pulse laser light and the CW laser light at the same time, and corresponds to the first embodiment.

In this example, the pulse laser light is XeF pulse laser light, and the CW laser light is blue CW laser light having a central wavelength of about 450 nm. The CW laser light irradiation period is about 10 sec., which includes the irradiation period of irradiation only with the CW laser light during preheating, and the irradiation period of simultaneous irradiation together with the pulse laser light.

As indicated by the graph, the higher the fluence of the pulse laser light is, the larger to a certain value the particle diameter of the crystal is. In the case of irradiation only with the pulse laser light, the peak value of the particle diameter is about 500 nm. The fluence of the pulse laser light in this case is about 360 mJ/cm$^2$. On the other hand, in the case of preheating by irradiation with the CW laser light, the peak value of the particle diameter is about 800 nm, which is larger than that in the case of single irradiation. The fluence of the pulse laser light in the case where the particle diameter indicates the peak value is about 300 mJ/cm$^2$. It is understood that the fluence is suppressed to be low by about 60 mJ/cm$^2$ in comparison with the single irradiation.

It can be understood, from the graph, that in the case of preheating by the CW laser light, the range of the fluence whose effect of increase in particle diameter is significant in comparison with the case of single irradiation only with the pulse laser light is a range from 240 mJ/cm$^2$ to 300 mJ/cm$^2$. Accordingly, it is preferable that the range of the fluence of the pulse laser light be the range from 240 mJ/cm$^2$ to 300 mJ/cm$^2$.

On the other hand, it is preferable that the range of the CW laser light irradiation energy density (J/cm$^2$) be a range where irradiation with the CW laser light exerts an effect of assisting the pulse laser light to increase the particle diameter, and the amorphous silicon film 31d can be heated to the target temperature Tt. Specifically, the preferable range of the CW laser light irradiation energy density on the amorphous silicon film 31d is a range from 318 J/cm$^2$ to 6,340 J/cm$^2$. Here, the CW laser light irradiation energy density means the total irradiation energy density of the CW laser light with which one annealing region is irradiated.

The CW laser light irradiation energy density (J/cm$^2$) is the product of the optical intensity density (W/cm$^2$) and the irradiation time (sec.). The CW laser light irradiation period is about 10 sec. in the above example. It is preferable that the period be adjusted in a range from about 1 sec. to about 10 sec. In the case where the range of the irradiation time is adjusted in the range from about 1 sec. to 10 sec., it is preferable that the optical intensity density (W/cm$^2$) that is the target output Wt of the CW laser light be adjusted in a range from about 318 W/cm$^2$ to 634 W/cm$^2$ in order to obtain the irradiation energy density.

In the case of preheating by the irradiation with the CW laser light, the annealing control unit 32A controls the CW laser light irradiation energy density by controlling at least one of the optical intensity density and the irradiation time.

As illustrated in FIG. 6, in this example, the irradiation with the CW laser light is continued during the irradiation with the pulse laser light even after the irradiation with the pulse laser light is started. That is, the CW laser light irradiation periods temporally overlap all the irradiation periods with the pulse laser light. The pulse laser light and the CW laser light are simultaneously emitted.

Crystallization advances in processes of melting and subsequently resolidifying the amorphous silicon film 31d. If the heating by the CW laser light is continued after the irradiation with the pulse laser light is started, the crystallization advances after the amorphous silicon film 31d is melted, and the temperature of the polysilicon film 31e can be maintained to be high in the process of modification to the polysilicon film 31e. Thereby, the solidification time is increased, and the time of growth of crystals can be sufficiently secured. Consequently, the crystals further grow, and the effect of increasing the particle diameters of the crystals can be expected.

In this example, the description has been made with the example where the entire pulse laser light irradiation period overlaps the CW laser light irradiation period. Alternatively, the pulse laser light irradiation period and the CW laser light irradiation period may partially overlap each other.

3.4 Modification Example 1

As for the timing of completion of the irradiation with the CW laser light, in the example of FIG. 6, the irradiation with the CW laser light is finished at the substantially same time as the completion of the irradiation with the pulse laser light. Alternatively, the delay time from the completion of the irradiation with the pulse laser light to the completion of the irradiation with the CW laser light may be increased. If the irradiation with the CW laser light is continued even after the completion of the irradiation with the pulse laser light, the solidification time is further increased in comparison with the example of FIG. 6. Consequently, the effect of further increasing the particle diameters of the crystals can be expected. The annealing control unit 32A can increase the delay time by controlling the time during which the shutter 42 is closed.

3.5 Modification Example 2

FIG. 9 is a timing chart according to a modification example 2 of the first embodiment. Unlike the example of FIG. 6, in the modification example 2, only preheating by the irradiation with the CW laser light is performed, and the irradiation with the CW laser light is stopped at the same time as the start of irradiation with the pulse laser light. As in the modification example 2, the CW laser light irradiation period and the pulse laser light irradiation period do not necessarily overlap each other.

Also in this case, the preheating by irradiation with the CW laser light can exert an effect of suppressing the output of the pulse laser light required to melt the amorphous silicon film 31d. Also in this example, the temperature T of the amorphous silicon film 31d increases close to the melting point Tm at the time point when the irradiation with the pulse laser light is started. Accordingly, it can be considered that the solidification time is longer than that in the comparative example although the solidification time is shorter than that in the example of FIG. 6 and the modification example 1. Consequently, the effect of increasing the particle diameter can also be expected. It is a matter of course that it is expected that a possible period of simultaneous irradiation with the CW laser light and the pulse laser light as with the aforementioned example of FIG. 6 and modification example 1 exerts a further effect of increasing the particle diameters. Accordingly, it is preferable to provide this period.

3.6 Preferable Range of Central Wavelength of CW Laser Light

Figure 10A:
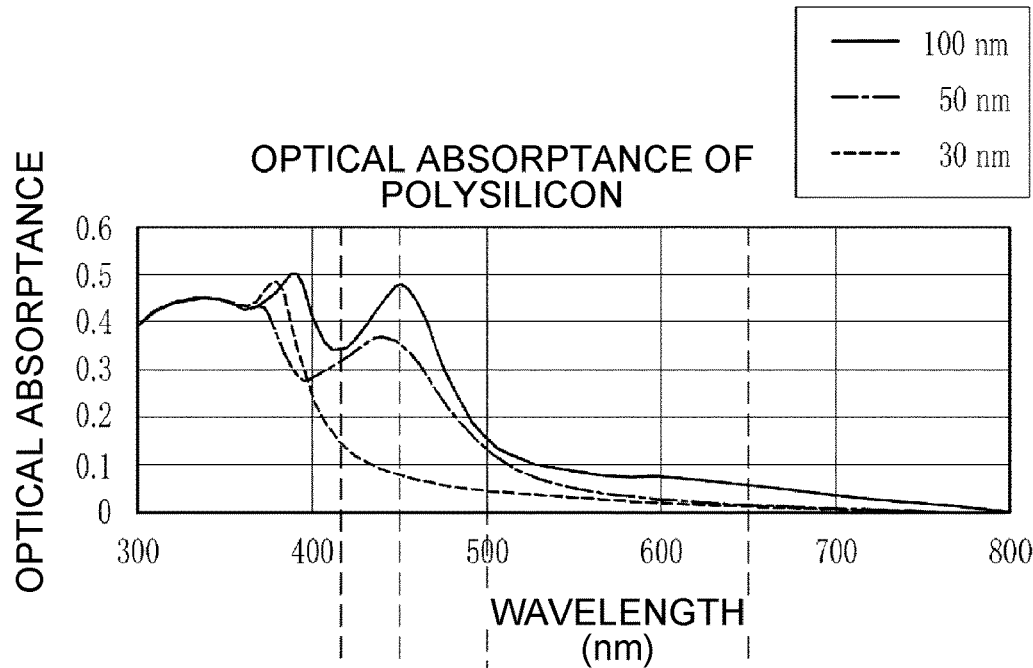
FIG. 10A is a graph illustrating wavelength dependence of optical absorptance of polysilicon.
Figure 10B:
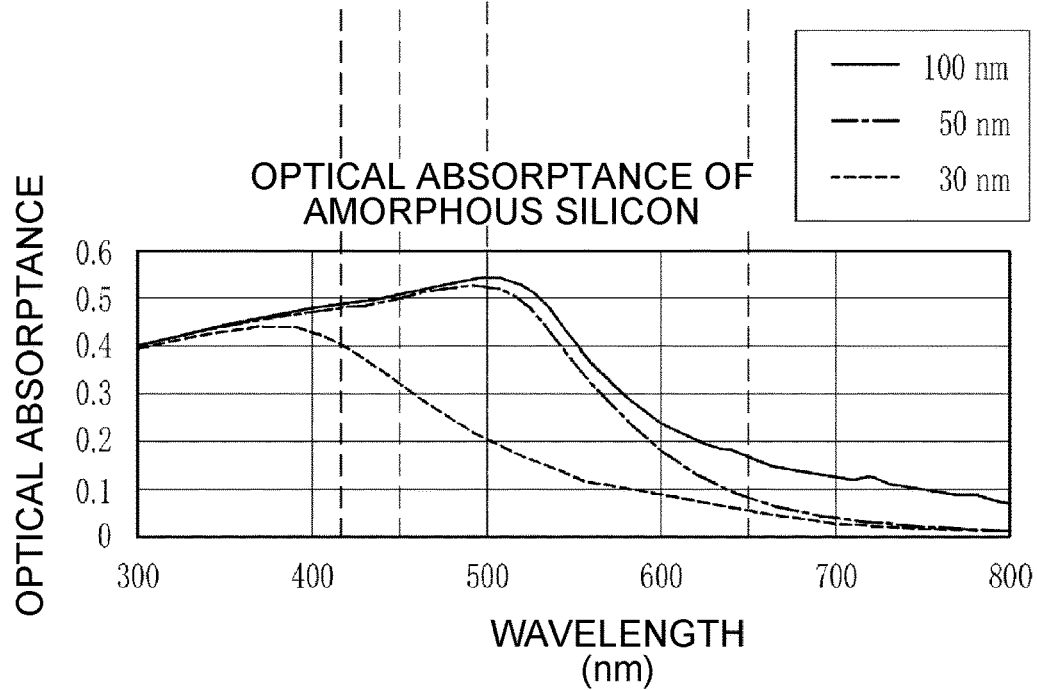
FIG. 10B is a graph illustrating wavelength dependence of optical absorptance of amorphous silicon.

FIGS. 10A and 10B are graphs illustrating the wavelength dependences of optical absorptances of polysilicon and amorphous silicon. FIG. 10A is the graph of the polysilicon. FIG. 10B is the graph of the amorphous silicon. The higher the optical absorptance is, the higher the efficiency of increase in temperature is. In each of FIGS. 10A and 10B, a solid line is a graph in a case where the film thickness is 100 nm, a chain line is a graph in a case where the film thickness is 50 nm, and a broken line is graph in a case where the film thickness is 30 nm. The film thicknesses of 30 nm, 50 nm and 100 nm are typical film thicknesses in a case where a TFT substrate is manufactured. FIG. 10A illustrates data obtained by calculation in a condition where a polysilicon film is formed on a silicon dioxide film ($SiO_2$) serving as a base film. FIG. 10B illustrates data obtained by calculation in a condition where an amorphous silicon film is formed on a silicon dioxide film ($SiO_2$) serving as a base film.

In general, a case that can be regarded as efficient optical absorptance characteristics is a case where the optical absorptance has a value of 0.15 or higher. Only if the value is at least 0.15, a heating effect by irradiation with the CW laser light can be expected. First, in a case where the film thickness is 100 nm, as illustrated in FIG. 10B, the optical absorptance of the amorphous silicon is 0.15 or higher with respect to red laser light having a wavelength of about 650 nm. However, the optical absorptance of polysilicon in this wavelength is 0.05, which is lower than that of amorphous silicon.

As described above, if irradiation is simultaneously performed with the CW laser light even after start of irradiation with the pulse laser light, the temperature of the polysilicon can be maintained to be high in the crystallization process. Consequently, the crystal growth time can be sufficiently secured. Accordingly, an effect of increasing the particle diameters can be expected. It is herein assumed that the CW laser light irradiation exerts the heating effect of increasing the temperature not only for amorphous silicon but also for polysilicon. The red laser light having a wavelength of about 650 nm exerts a relatively large heating effect for amorphous silicon. However, since polysilicon has a low optical absorptance, the heating effect is small for polysilicon. Accordingly, even if the red laser light having a wavelength of about 650 nm is used, the effect of increasing the particle diameters cannot be expected.

As illustrated in FIG. 10A, in a range where the wavelength exceeds 500 nm for polysilicon, the optical absorptance is less than 0.15 for any film thickness. Consequently, the heating effect is small. Accordingly, even if the CW laser light having a wavelength exceeding 500 nm is used, the effect of increasing the particle diameters cannot be expected.

On the other hand, in FIG. 10A, in cases where the film thickness is 50 nm and 100 nm, the optical absorptance is 0.15 or higher for the wavelength of 500 nm or lower. Accordingly, also in the crystallization process, light is sustainably and effectively absorbed, and the temperature of polysilicon can be maintained to be high. Consequently, the effect of increasing the particle diameters can be expected. Consequently, in the case where the film thickness ranges from 50 nm to 100 nm, it is preferable that the CW laser light have a wavelength of about 500 nm or lower. In the case where the film thickness ranges from 50 nm to 100 nm, the optical absorptances of both polysilicon and amorphous silicon have a favorable value for a wavelength of about 450 nm. Accordingly, it is more preferable that the wavelength of the CW laser light be about 450 nm.

As illustrated in FIG. 10A, in a case where the film thickness of polysilicon is 30 nm, the optical absorptance does not become 0.15 or higher until the wavelength becomes 420 nm or shorter. Accordingly, also in consideration of the case where the film thickness is 30 nm, it is preferable that the CW laser light have a central wavelength of about 420 nm or shorter.

The CW laser light having a wavelength of 420 nm or shorter encompasses, for example, the CW laser light output by GaN semiconductor laser, the third harmonic wave of continuous oscillating YAG laser or fiber laser, and AlGaN semiconductor laser. The CW laser light of the GaN semiconductor laser has a central wavelength of 405 nm or 450 nm. The third harmonic wave has a central wavelength of 355 nm. The AlGaN semiconductor laser has a central wavelength of 330 nm. The CW laser light having a wavelength of 500 nm or shorter encompasses not only the aforementioned types but also Ar ion laser having a central wavelength of 488 nm, and a semiconductor laser having a central wavelength of 450 nm.

3.7 Preferable Range of Central Wavelength of Pulse Laser Light

Figure 11A:
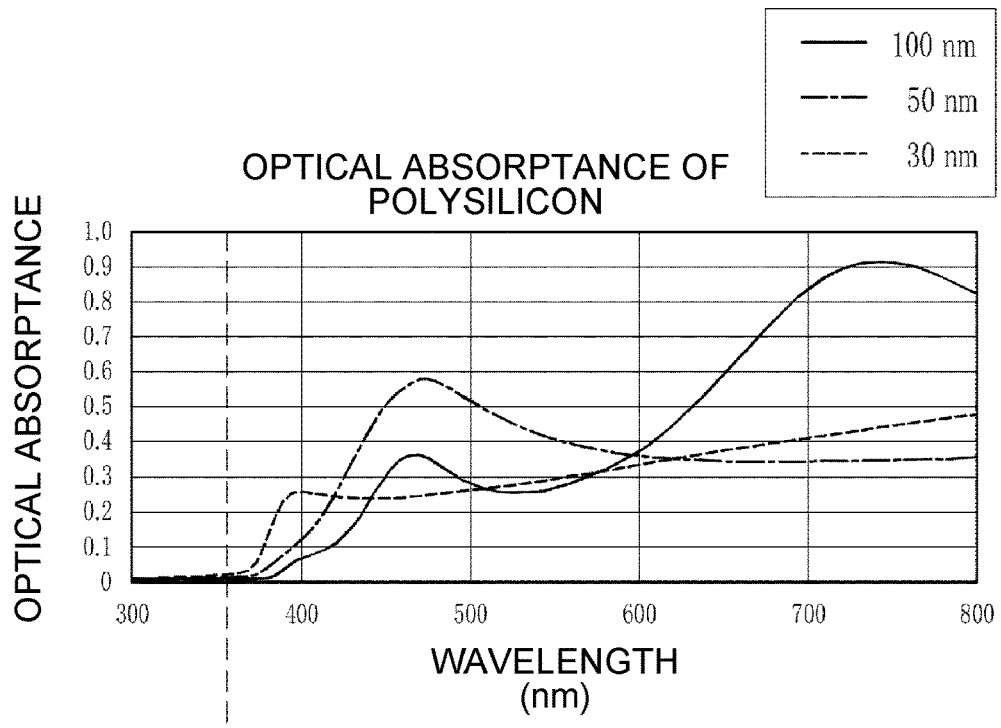
FIG. 11A is a graph illustrating wavelength dependence of optical transmittance of polysilicon.
Figure 11B:
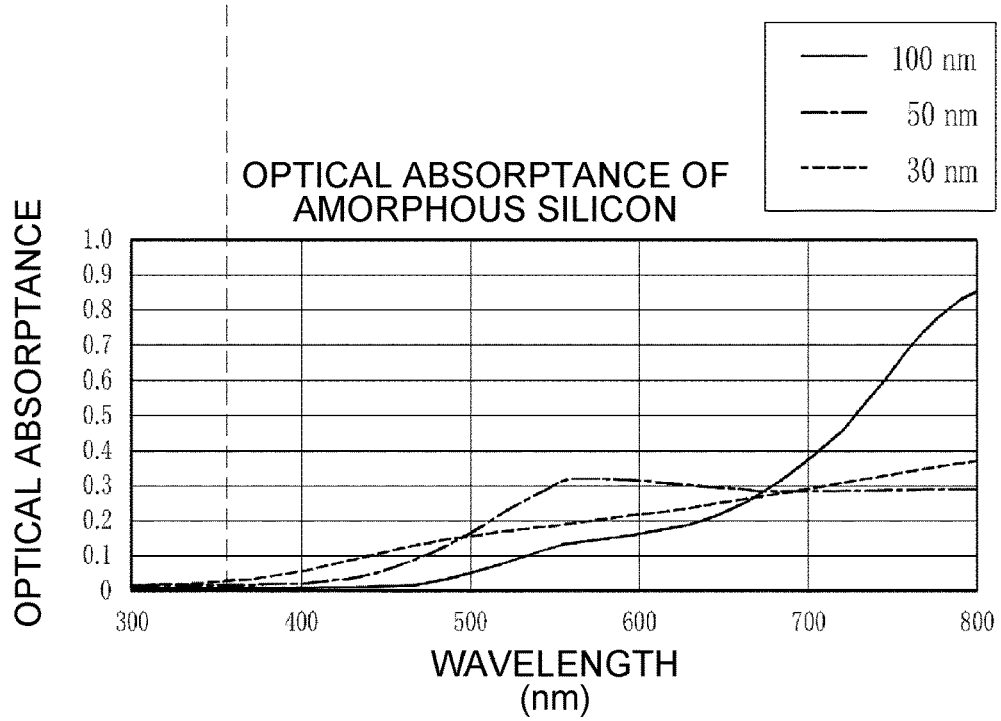
FIG. 11B is a graph illustrating wavelength dependence of optical transmittance of amorphous silicon.

FIGS. 11A and 11B are graphs illustrating the wavelength dependences of optical transmittances of polysilicon and amorphous silicon. FIG. 11A is the graph of the polysilicon. FIG. 11B is the graph of the amorphous silicon. As with FIGS. 10A and 10B, in each of FIGS. 11A and 11B, a solid line is a graph in a case where the film thickness is 100 nm, a chain line is a graph in a case where the film thickness is 50 nm, and a broken line is a graph in a case where the film thickness is 30 nm. FIG. 11A illustrates data obtained by calculation in a condition where a polysilicon film is formed on a silicon dioxide film ($SiO_2$) serving as a base film. FIG. 11B illustrates data obtained by calculation in a condition where an amorphous silicon film is formed on a silicon dioxide film ($SiO_2$) serving as a base film.

The pulse laser light has a higher optical intensity than the CW laser light. Consequently, there is a possibility that the pulse laser light passing a silicon film, such as a polysilicon film or an amorphous silicon film, damages a glass substrate or a resin substrate. In particular, in a case where a resin substrate such as of PET (polyethylene terephthalate), PEN (polyethylene naphthalate) or PI (polyimide) is used, this substrate tends to be more damaged than a glass substrate.

As illustrated in FIGS. 11A and 11B, the optical transmittances of polysilicon and amorphous silicon each significantly decrease at a wavelength of 365 nm or shorter. Accordingly, it is more preferable that the wavelength of the pulse laser light be 365 nm or shorter. The aforementioned excimer pulse laser device or the solid-state pulse laser device may be adopted as the pulse laser device that emits pulse laser light having such a wavelength.

4. Laser Annealing Device of Second Embodiment

4.1 Configuration

Figure 12:
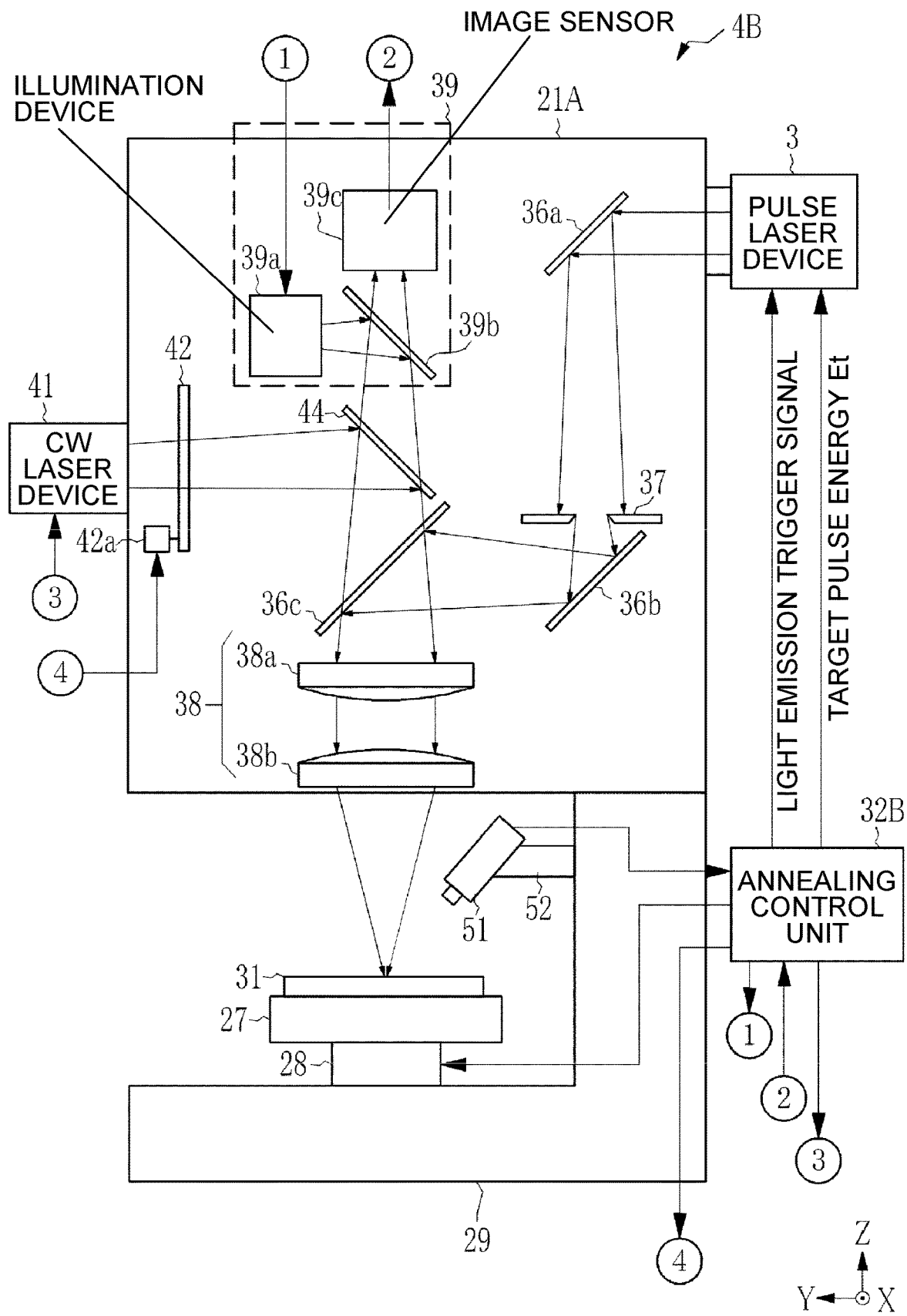
FIG. 12 schematically illustrates a configuration of a laser annealing device according to a second embodiment.

FIG. 12 schematically illustrates a configuration of a laser annealing device according to a second embodiment. The laser annealing device in the second embodiment includes an annealing device 4B instead of the annealing device 4A in the first embodiment. The pulse laser device 3 is analogous to that in the first embodiment.

The annealing device 4B is different in including a radiation pyrometer 51 in addition to the configuration of the annealing device 4A according to the first embodiment illustrated in FIG. 4. The radiation pyrometer 51 is fixed to the frame 29 via a holder 52. The radiation pyrometer 51 detects infrared rays emitted from the surface of the irradiation object 31, and measures the temperature of the amorphous silicon film 31$d$ residing on the surface of the irradiation object 31. The radiation pyrometer 51 outputs the measured temperature as a measurement result to an annealing control unit 32B.

The laser annealing device 4B includes the annealing control unit 32B instead of the annealing control unit 32A in the first embodiment. The annealing control unit 32B has a function of controlling the irradiation start timing of the pulse laser light on the basis of the measurement result of the radiation pyrometer 51. The control unit 32B is different in this point from the annealing control unit 32A. The other configuration points are analogous to those of the annealing device 4A according to the first embodiment, respectively.

4.2 Operation

Figure 13:
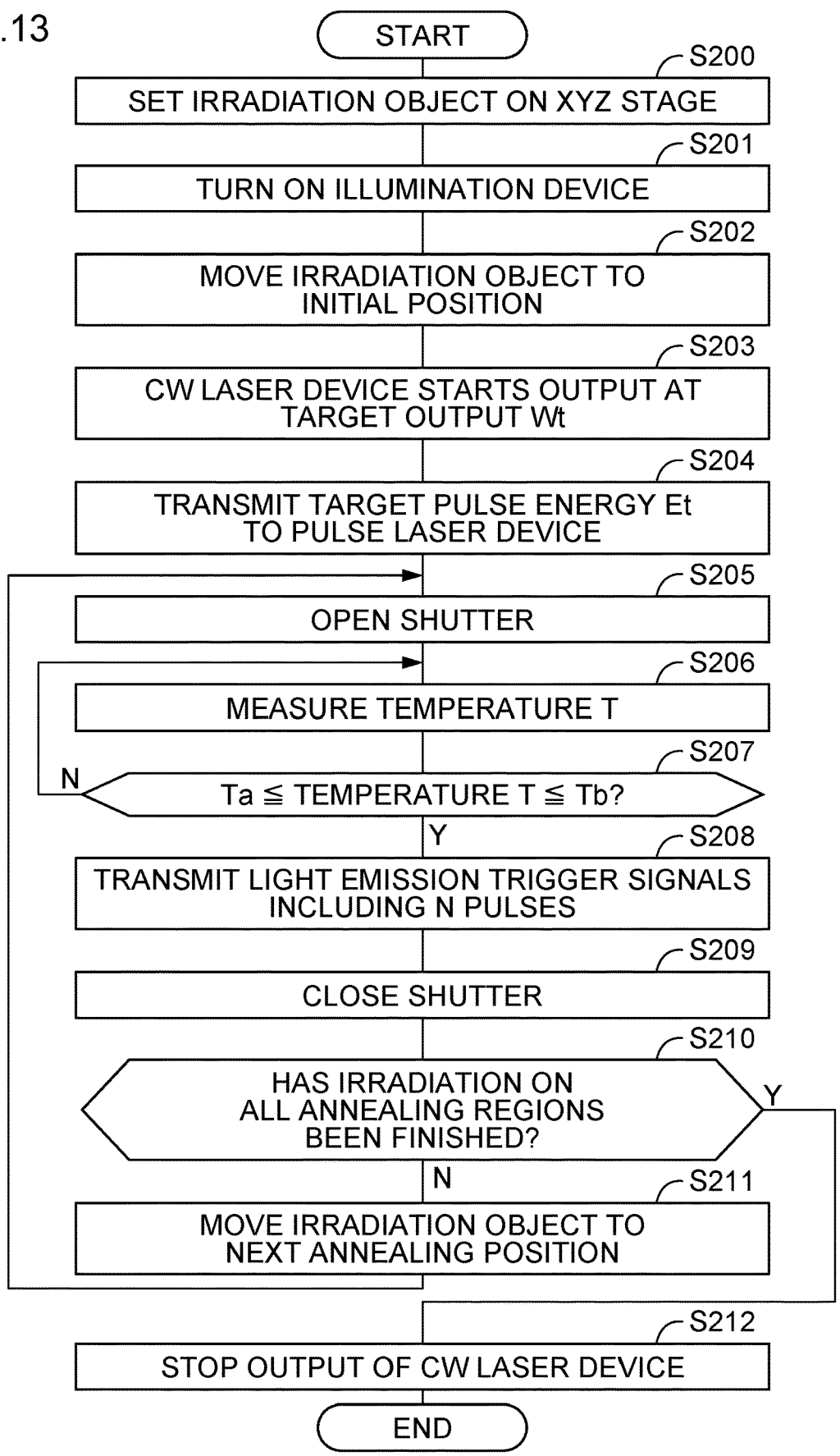
FIG. 13 is a flowchart illustrating procedures in an annealing process in the second embodiment.
Figure 14:
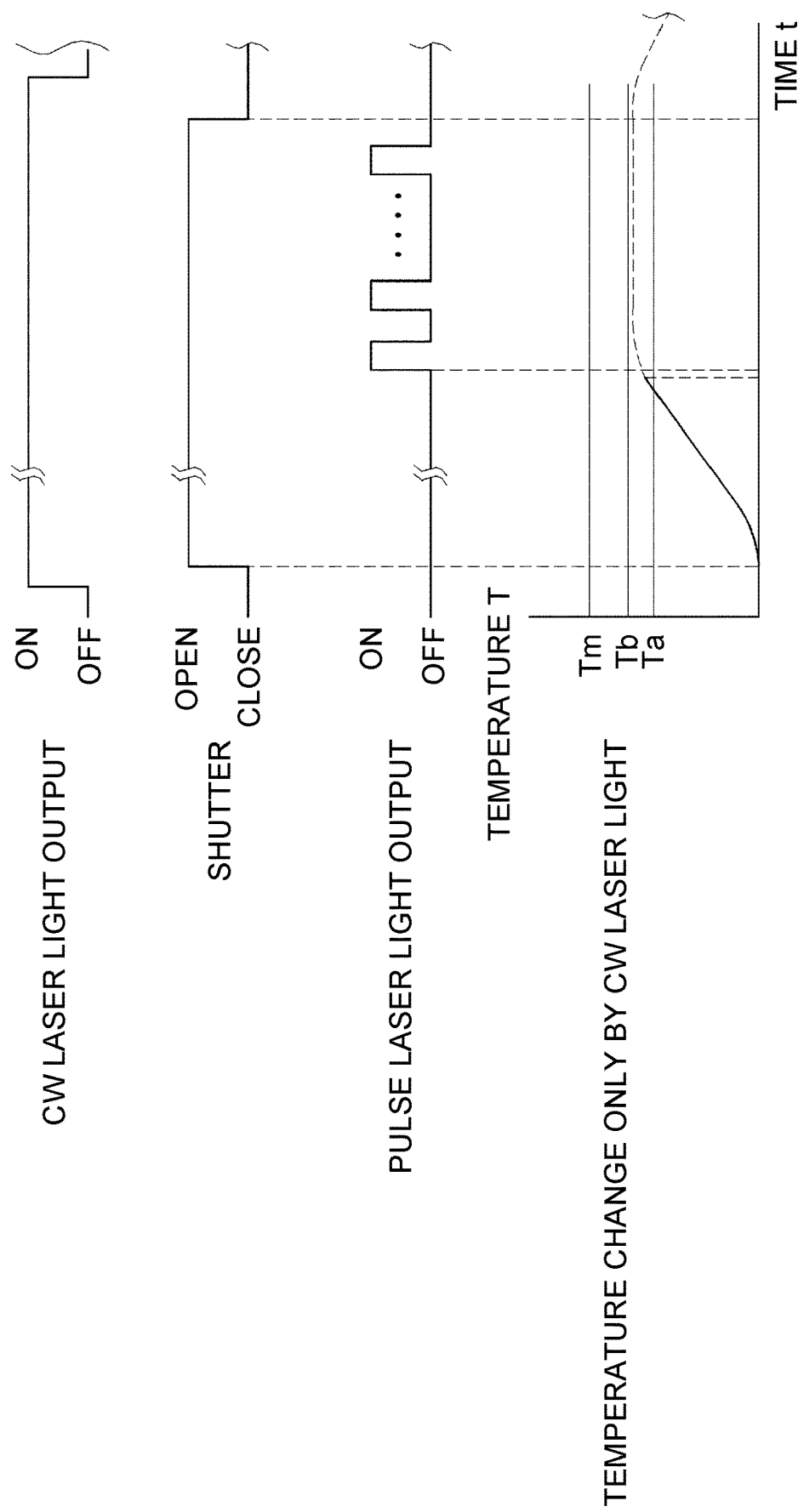
FIG. 14 is a timing chart illustrating temporary changes in output states of CW laser light and pulse laser light and in a temperature of a surface of an irradiation object only due to CW laser light.

Referring to FIGS. 13 and 14, the operation of the second embodiment is described. FIG. 13 is a flowchart illustrating procedures in an annealing process in the second embodiment. FIG. 14 is a timing chart illustrating temporary changes in output states of CW laser light and pulse laser light and in the temperature of the surface of the irradiation object 31 only due to the CW laser light.

As illustrated in FIG. 13, the processing steps S200 to S205 are respectively analogous to the processing steps S100 to S105 illustrated in FIG. 5. In S205, the annealing control unit 32B opens the shutter and starts irradiation with the CW laser light. After starting the irradiation with the CW laser light, the annealing control unit 32B starts to measure the temperature T through the radiation pyrometer 51 in S206.

In S207, the annealing control unit 32B determines whether or not the temperature T of the amorphous silicon film 31$d$ of the irradiation object 31 is in a range from a predetermined temperature Ta to a predetermined temperature Tb inclusive on the basis of the measurement result input from the radiation pyrometer 51. If the temperature T does not reach the aforementioned range (N in S207), the annealing control unit 32B returns the processing to S206. If the temperature T reaches the aforementioned range (Y in S207), the processing proceeds to S208, the light emission trigger signal including N pulses is transmitted, and irradiation with the pulse laser light is performed. The processing steps S208 to S212 are respectively analogous to the processing steps S108 to S112 in the first embodiment.

Here, the range defined by the predetermined temperature Ta and the predetermined temperature Tb is in the range of the target temperature Tt. As described above, the range of the target temperature Tt is a range of $1{,}300° C. \leq Tt < 1{,}414° C$. For example, the predetermined temperature Ta is 1,400° C., and the predetermined temperature Tb is 1,413° C.

4.3 Working Effect

In the second embodiment, the temperature T of the amorphous silicon film 31$d$ is measured through the radiation pyrometer 51. After it is confirmed that the temperature T is in the range between the predetermined temperatures Ta and Tb, the irradiation with the pulse laser light is started. Accordingly, this embodiment has the following advantages in comparison with the first embodiment that controls the irradiation start timing through the timer.

First, the temperature T immediately before start of the irradiation with the pulse laser light becomes stable. The output of the pulse laser light is preset. Consequently, there is a possibility that the stability of the temperature T immediately before the start, in turn, stabilizes the temperature T during irradiation with the pulse laser light. The stability of the temperature T during irradiation with the pulse laser light exerts an effect of uniforming the particle diameters of crystals of the polysilicon film 31e.

According to the types of the irradiation objects 31, the materials of the substrates, such as glass substrates and resin substrates, are different, and the film thicknesses of the amorphous silicon films 31d are different, in some cases. If the material of the substrate or the film thickness is different, the increase rate of the temperature T of the amorphous silicon film 31d is different even with the CW laser light having the same output. Even in such a case, because the temperature T is actually measured, the temperature T immediately before start of irradiation with the pulse laser light can be stabilized without setting in conformity with the material of the substrate and the film thickness.

4.4 Modification Example

The annealing control unit 32B may apply feedback control to the output of the CW laser device 41 on the basis of the measurement result of the radiation pyrometer 51. Specifically, if the temperature T of the amorphous silicon film 31d is lower than the predetermined temperature Ta, the annealing control unit 32B increases the output of the CW laser light of the CW laser device 41. On the other hand, if the temperature T exceeds the predetermined temperature Tb, the output of the CW laser light is reduced.

4.5 Other

In a case where the output of the CW laser light of the CW laser device 41 can be controlled, the start and finish of irradiation with the CW laser light can be controlled by controlling the output of the CW laser device 41. In this case, the shutter 42 is not necessarily provided.

The radiation pyrometer 51 that measures the temperature T may be, for example, a two-color pyrometer as described in the following literature (Literature: Journal of the Japan Society for Precision Engineering Vol. 61, No. 2 (1995) 278-282: "Measurement of flush temperature of ceramics irradiated with $CO_2$ laser"). The two-color pyrometer described in this literature measures the optical intensities of two wavelengths in the range from visible light to infrared light, and calculates the intensity ratio, thus measuring the temperature. The two-color pyrometer includes a Ge element and an InSb element, as a two-color pyrometer for thermal radiation light, for example. This pyrometer measures the temperature by measuring the intensity ratio on the basis of optical intensity signals output as voltages from the respective elements. The two-color pyrometer is suitable for measurement of the temperature rapidly varying in a minute process region of amorphous silicon or polysilicon.

5. Laser Annealing Device of Third Embodiment

5.1 Configuration

Figure 15:
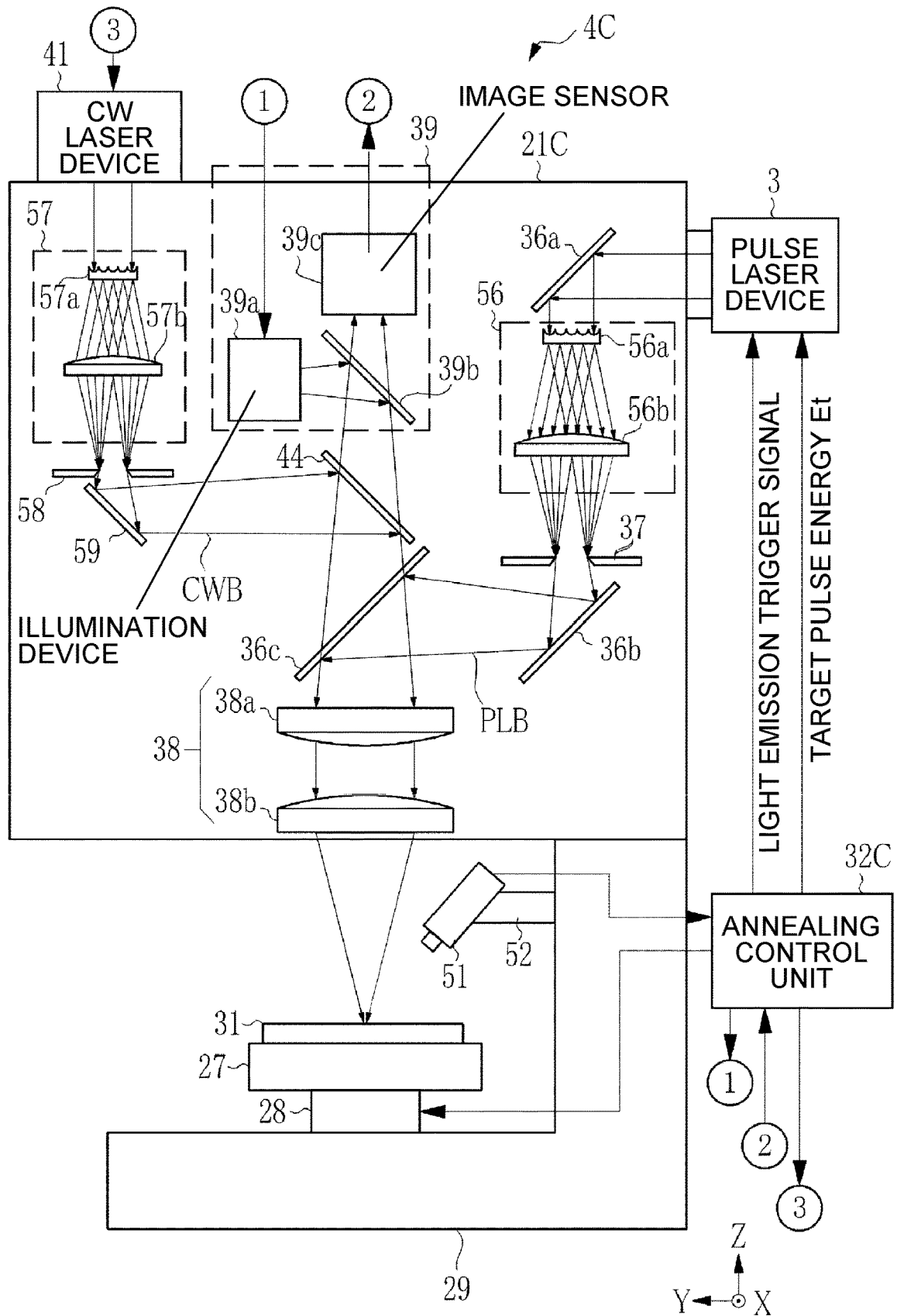
FIG. 15 schematically illustrates a configuration of a laser annealing device according to a third embodiment.

FIG. 15 schematically illustrates a configuration of a laser annealing device according to a third embodiment. The laser annealing devices in the first embodiment illustrated in FIG. 4 and the second embodiment illustrated in FIG. 12 irradiate the irradiation object 31 with CW laser light and pulse laser light in a state where this object 31 is stopped. On the other hand, the laser annealing device in the third embodiment irradiates the irradiation object 31 with the CW laser light and the pulse laser light while moving the irradiation object 31 in a predetermined direction. The laser annealing device in the third embodiment includes an annealing device 4C and an optical system 21C. The pulse laser device 3 is analogous to the devices in the first and second embodiments.

In the third embodiment, the irradiation object 31 is, for example, a substrate for a large-sized display, and its entire surface on which the amorphous silicon film 31d is formed serves as an annealing region. The annealing device 4C moves the irradiation object 31 in the Y axis direction at a constant speed by the XYZ stage 28 with respect to the position to be irradiated with the CW laser light and the pulse laser light emitted from the optical system 21C. The CW laser light and the pulse laser light are emitted to the irradiation object 31 passing the irradiation position at the constant speed.

The optical system 21C includes a first beam homogenizer 56 for the pulse laser light, and a second beam homogenizer 57 for the CW laser light. The first beam homogenizer 56 is disposed on the optical path between the highly reflective mirror 36a and the mask 37. The first beam homogenizer 56 includes a fly-eye lens 56a and a condenser optical system 56b.

The mask 37 has a linear-shaped opening. When the pulse laser light passes the opening of the mask 37, the sectional shape of the beam is adjusted to be a linear shape. Here, at the mask 37, the pulse laser light where the sectional shape has been formed to be the linear shape and the opening image of the mask 37 has been transferred and image-formed to be the linear shape by the transfer optical system 38 is called a line beam PLB.

In the first beam homogenizer 56, the condenser optical system 56b is disposed so that the focus of the fly-eye lens 56a can coincide with the front focus of the condenser optical system 56b. The mask 37 is disposed so as to coincide with the rear focus of the condenser optical system 56b.

The second beam homogenizer 57 is disposed on the optical path between the CW laser device 41 and the highly reflective mirror 44. As with the first beam homogenizer 56, the second beam homogenizer 57 includes a fly-eye lens 57a and a condenser optical system 57b. A mask 58 and a highly reflective mirror 59 are disposed on the optical path between the second beam homogenizer 57 and the highly reflective mirror 44.

The mask 58 has a linear-shaped opening. When the CW laser light passes the opening of the mask 58, the sectional shape of the beam is adjusted to be a linear shape. Here, at the mask 58, the CW laser light where the sectional shape has been formed to be the linear shape and the opening image of the mask 58 has been transferred and image-formed to be the linear shape by the transfer optical system 38 is called a line beam CWB.

In the second beam homogenizer 57, the condenser optical system 57b is disposed so that the focus of the fly-eye lens 57a can coincide with the front focus of the condenser optical system 57b. The mask 58 is disposed so as to coincide with the rear focus of the condenser optical system 57b.

The highly reflective mirror 59 is disposed at a position of reflecting the line beam CWB having passed the opening of the mask 58 toward the highly reflective mirror 44. The highly reflective mirror 44 is disposed so as to reflect the line beam CWB toward the transfer optical system 38 via the highly reflective mirror 36c. Thereby, the highly reflective mirror 44 and the highly reflective mirror 36c combine the optical path of the line beam CWB and the optical path of the line beam PLB. The transfer optical system 38 transfers the line beam CWB and the line beam PLB to the irradiation position.

Figure 16:
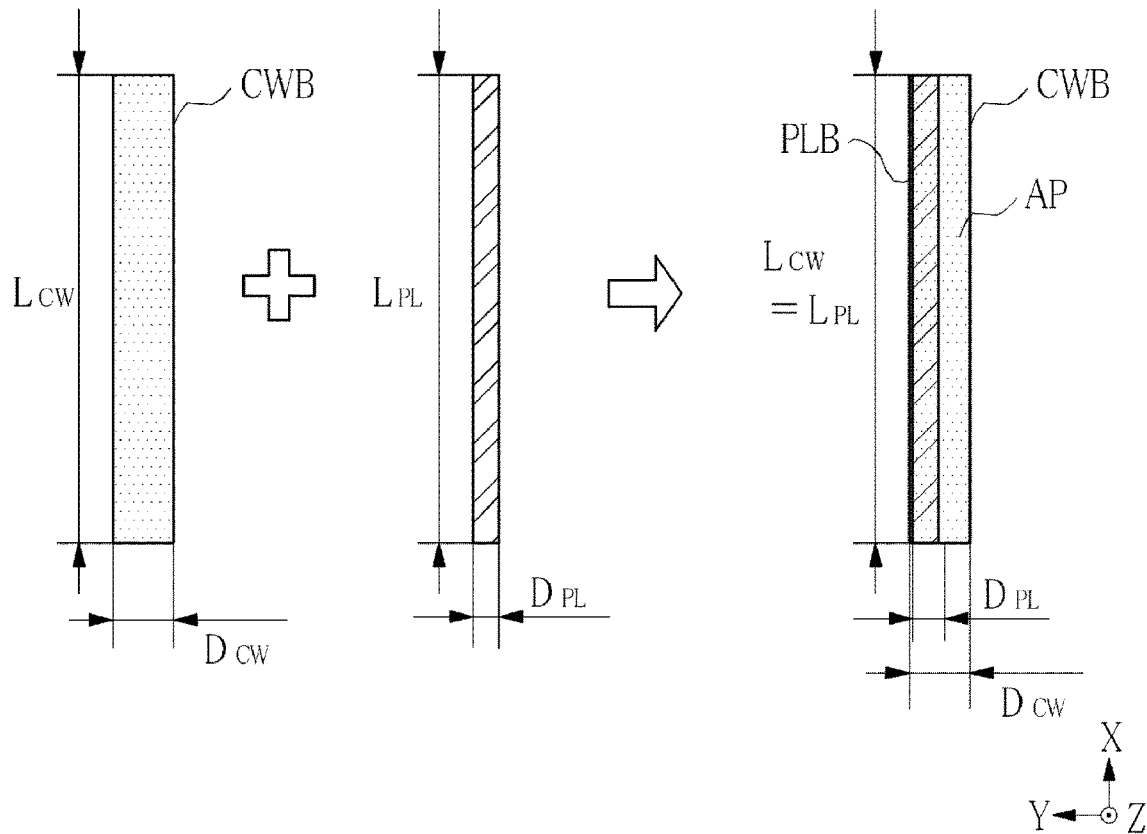
FIG. 16 is a diagram illustrating overlap of irradiation regions of a CW laser light line beam and a pulse laser light line beam.
Figure 17:
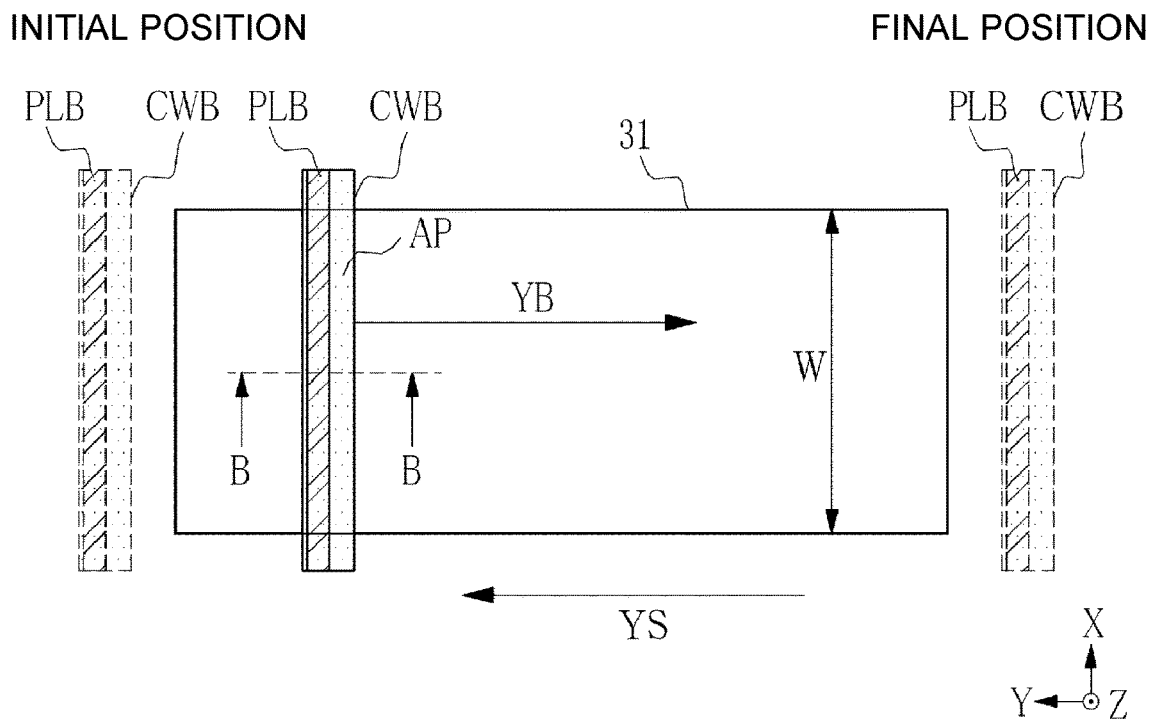
FIG. 17 illustrates a relationship between a relatively moving irradiation object and line beams.

FIG. 16 is a diagram illustrating the overlap between the line beams CWB and PLB. FIG. 17 illustrates the relationship between the relatively moving irradiation object 31 and the line beams CWB and PLB. As illustrated in FIGS. 16 and 17, the line beam CWB and the line beam PLB have irradiation regions each having a linear shape extending in the width direction (X axis direction) orthogonal to the movement direction (Y axis direction) of the irradiation object 31. The lengths $L_{CW}$ and $L_{PL}$ of the line beams CWB and PLB in the X axis direction are longer than a width W of the irradiation object 31 in the X axis direction, for example.

Accordingly, as illustrated in FIG. 17, only by moving the irradiation object 31 in one sense in the Y axis direction, the line beams CWB and PLB are relatively moved from the initial position to the final position with respect to the irradiation object 31. Thereby, the entire surface of the irradiation object 31 can be irradiated with the line beam CWB and the line beam PLB.

The beam width $D_{CW}$ of the line beam CWB in the Y axis direction is wider than the beam width $D_{PL}$ of the line beam PLB in the Y axis direction. The irradiation region of the line beam CWB and the irradiation region of the line beam PLB overlap each other in the Y axis direction, which is the movement direction of the irradiation object 31. In this example, the entire range of the irradiation region of the line beam PLB overlaps the irradiation region of the line beam CWB. That is, the irradiation region of the line beam CWB includes the entire irradiation region of the line beam PLB. As for the size of the line beam PLB, for example, the length $L_{PL}$ is 1,500 mm, and the beam width $D_{PL}$ is 400 μm.

To allow the irradiation object 31 passing the irradiation position to be irradiated with the line beam CWB before being irradiated with the line beam PLB, the irradiation region of the line beam CWB has a leading region AP residing before the irradiation region of the line beam PLB.

Here, as illustrated in FIG. 17, the movement direction of the irradiation object 31 in the Y axis direction is assumed as a YS direction. As the irradiation object 31 and the irradiation position are relatively moved with respect to each other, the irradiation regions of the line beams CWB and PLB advance in a YB direction with respect to the irradiation object 31. As for the line beam CWB advancing in the YB direction, the leading region AP resides frontward while the irradiation region of the line beam PLB resides backward. Thereby, the irradiation of the leading region AP with the line beam CWB can perform preheating.

The shapes and sizes of the line beams CWB and PLB and the degree of overlapping of the irradiation regions are determined by the shapes, sizes and arrangement positions of the masks 58 and 37.

Figure 18A:
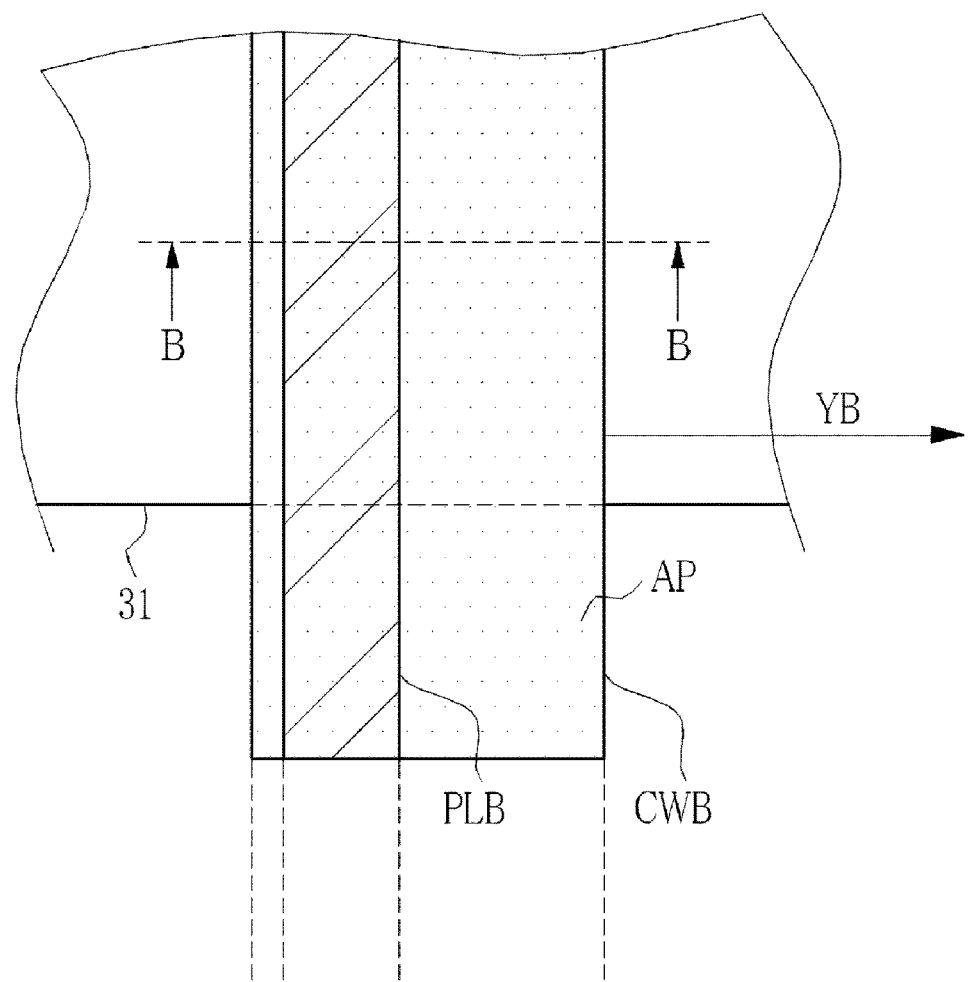
FIG. 18A illustrates an enlarged diagram of irradiation regions of line beams.
Figure 18B:
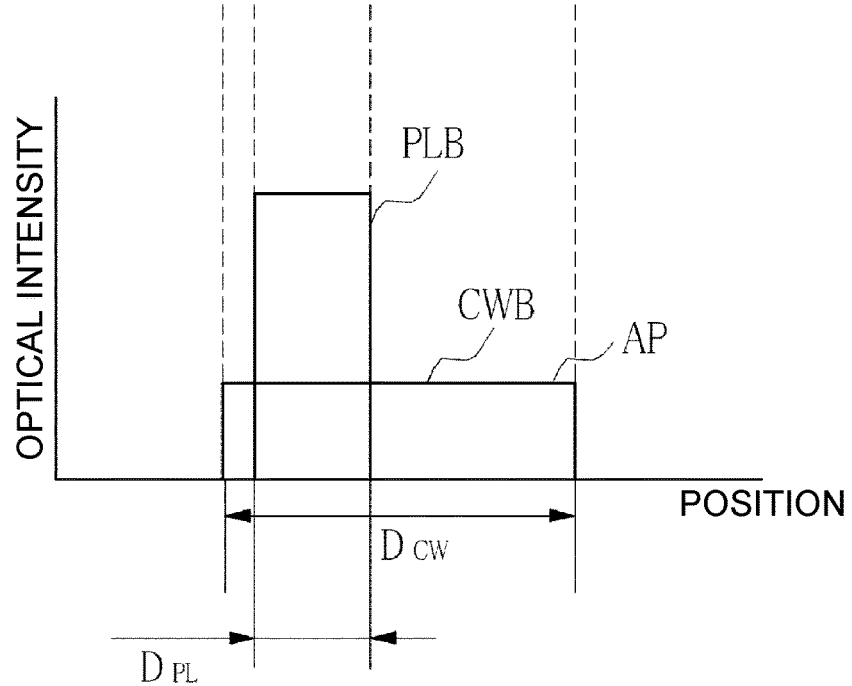
FIG. 18B illustrates optical intensity distributions of the line beams taken along line B-B of FIG. 18A.

FIG. 18A illustrates an enlarged diagram of the irradiation regions of the line beams CWB and PLB, and FIG. 18B illustrates the optical intensity distributions of the line beams CWB and PLB taken along line B-B. The line beam PLB has a higher optical intensity than the line beam CWB. Consequently, the optical intensity is relatively lower in the leading region AP, and is high in the region where the line beam PLB is positioned.

The radiation pyrometer 51 is disposed so as to measure the temperature of the irradiation object 31 passing the irradiation position in the leading region AP with the line beam CWB, more specifically, the temperature T of the amorphous silicon film 31d immediately before this film passes the irradiation position of the line beam PLB.

5.2 Operation

Figure 19:
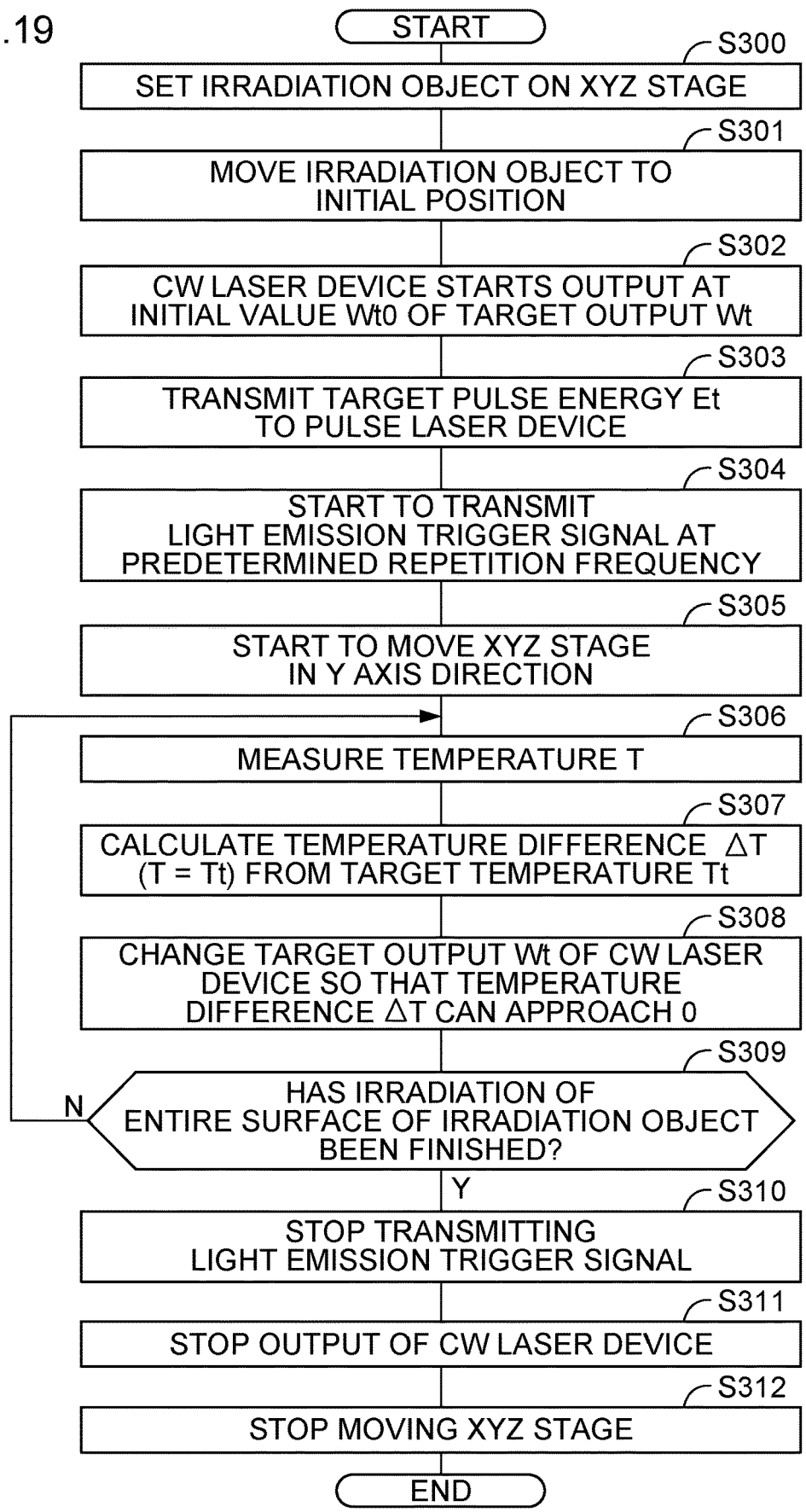
FIG. 19 is a flowchart illustrating procedures in an annealing process in the third embodiment.
Figure 20:
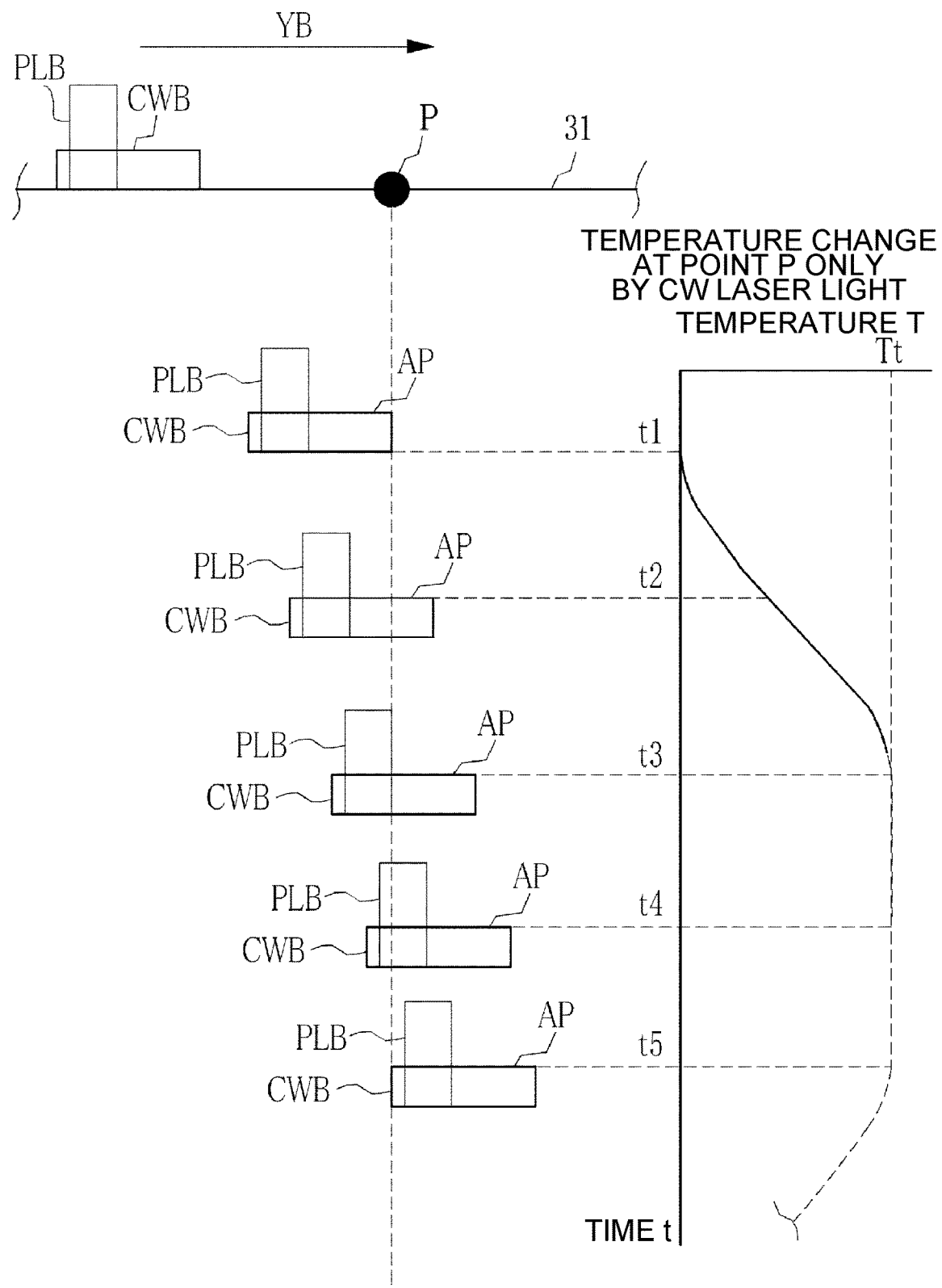
FIG. 20 is a diagram illustrating a temporary change in temperature at a point P in a case where relative movement with the irradiation object causes the line beam to pass the point P on an irradiation object 31.

Referring to FIGS. 19 and 20, the operation of the third embodiment is described. FIG. 19 is a flowchart illustrating procedures in an annealing process in the third embodiment. FIG. 20 is a diagram illustrating the temporary change in temperature at a point P in a case where relative movement with the irradiation object 31 causes the line beam CWB to pass the point P on the irradiation object 31.

As illustrated in FIG. 19, in S300, the irradiation object 31 for a large-sized display is set on the XYZ stage 28. In S301, an annealing control unit 32C moves the irradiation object 31 to an initial position.

In S302, the annealing control unit 32C transmits an initial value Wt0 of the target output Wt, to the CW laser device 41. Thereby, the CW laser device 41 starts outputting at the initial value Wt0. In S303, the annealing control unit 32C transmits the target pulse energy Et to the pulse laser device 3. In S304, transmission of the light emission trigger signal is started at the predetermined repetition frequency. Thereby, irradiation with the line beams CWB and PLB is started. As illustrated in FIG. 17, the irradiation regions of the line beams CWB and PLB overlap each other at the irradiation position. The irradiation region of the line beam CWB has the leading region AP.

In S305, the annealing control unit 32C starts to move the XYZ stage 28 in the Y axis direction, and accelerates the XYZ stage 28. The annealing control unit 32C controls the speed of the XYZ stage 28 so as to achieve movement at a predetermined constant speed at a time point when the line beam CWB reaches the irradiation object 31. Thereby, the irradiation object 31 moves at a predetermined constant speed in the Y axis direction. Meanwhile, the annealing control unit 32C applies feedback control to the output of the CW laser device 41 on the basis of the measurement result of the radiation pyrometer 51. In S306, the annealing control unit 32C causes the radiation pyrometer 51 to measure the temperature T of the amorphous silicon film 31d immediately before this film 31d passes the irradiation position. In S307, the temperature difference $\Delta T$ (=T−Tt) between the temperature T and the target temperature Tt is calculated. In S308, in the case of the temperature difference $\Delta T$, the annealing control unit 32C changes the target output Wt of the CW laser device 41 so that the temperature difference $\Delta T$ can approach 0.

In S309, the annealing control unit 32C determines whether irradiation of the entire surface of the irradiation object 31 has been finished or not. If irradiation of the entire surface has not been finished yet (N in S309), the processing returns to S306, and the processing steps S306 to S308 are repeated. If irradiation of the entire surface has been finished (Y in S309), the annealing control unit 32C stops transmitting the light emission trigger signal, and stops outputting the line beam PLB. In S311, the CW laser device 41 is stopped and the output of the line beam CWB is stopped accordingly. In S312, the movement of the XYZ stage 28 is stopped.

5.3 Working Effect

The temperature change at the point P on the irradiation object 31, with the irradiation object 31 passing the irradiation position, is illustrated in FIG. 20. Here, as with the first and second embodiments, the temperature change indicates temperature change only due to the CW laser light line beam CWB.

First, when the leading region AP of the line beam CWB reaches the point P at a time point t1, irradiation at the point P with the line beam CWB is started, and preheating by the CW laser light is started. The irradiation with the line beam CWB starts to increase the temperature T at the point P. When the leading region AP advances in the YB direction at a time point t2, the temperature T at the point P further increases. At a time point t3 that is immediately before the irradiation with the pulse laser light line beam PLB, that is, immediately before the irradiation region with the line beam PLB reaches the point P, it is preferable that the temperature T at the point P reaches the target temperature Tt.

The annealing control unit 32C applies feedback control to the output of the CW laser device 41 by repeating the processing steps S306 to S308 in FIG. 19, thus achieving control so that the temperature T can reach the target temperature Tt. Thereby, before start of irradiation with the line beam PLB, irradiation of the leading region AP with the line beam CWB performs preheating so that the temperature T of the amorphous silicon film 31d can reach the target temperature Tt.

In FIG. 20, after the time point t3, irradiation with the line beam PLB at the point P is started. At this time point, the preheating is achieved such that the temperature T is the target temperature Tt. Consequently, the line beam PLB can be emitted in the preheated state. Accordingly, as with the first and second embodiments, the output of the pulse laser light line beam PLB can be suppressed, by an amount according to the preheating due to irradiation with the CW laser light line beam CWB.

During irradiation with the line beam PLB, irradiation with the line beam CWB is simultaneously performed. Accordingly, as described in the first embodiment, in the process of modification from the amorphous silicon film 31d to the polysilicon film 31e, the temperature of the polysilicon film 31e can be maintained to be high. The temperature of the polysilicon film 31e thus maintained to be high increases the solidification time. Consequently, an effect of increasing the particle diameters of crystals can be expected.

In the third embodiment, the irradiation with the CW laser light and the pulse laser light is performed while the irradiation object 31 is moved. Consequently, this embodiment has an improved throughput of annealing in comparison with the first and second embodiments. Accordingly, this embodiment is advantageous in a case of processing the irradiation object 31 for a large-sized display. The dimensions of the irradiation object 31 for a large-sized display may be, for example, 2,880 mm×3,130 mm or 3,000 mm×3,320 mm. It is specifically effective for the irradiation object 31 having such a size.

In the third embodiment, annealing is continuously performed while the irradiation object 31 is moved. Consequently, the large annealing region can be uniformly annealed. In the case where the laser annealing device in the first or second embodiment anneals a large annealing region, annealing is required to be performed multiple times while the irradiation regions with the CW laser light and the pulse laser light are changed. In this case, a part where the irradiation regions overlap with each other and a part where the irradiation regions do not overlap may occur, and the uniformity of the particle diameters of crystals may decrease. In the third embodiment, the large annealing region can be uniformly annealed. Consequently, the particle diameters of crystals are uniformed.

In the third embodiment, because the temperature T is actually measured, the temperature T immediately before start of irradiation with the pulse laser light can be stabilized without setting in conformity with the material of the substrate and the film thickness.

It should be noted that the description has been made using the example of applying feedback control to the output of the CW laser device 41 on the basis of the measured temperature T. Alternatively, the feedback control is not necessarily applied. In this case, the output of the CW laser light allowing the target temperature Tt to be achieved is preliminarily set, and the set output is transmitted to the CW laser device 41. The set value may be stored in an internal storage in the laser annealing device, or be read from an external device.

5.4 Modification Example 1

At the point P on the irradiation object 31 passing the irradiation position, the irradiation with the line beam CWB may be completed at the same time of completion of irradiation with the line beam PLB. Alternatively, the irradiation with the line beam CWB may be continued even after completion of the irradiation with the line beam PLB. As described above, if the irradiation with the line beam CWB is continued even after the completion of the irradiation with the line beam PLB, the effect of increasing the particle diameters can be expected. The timing of completion of irradiation with the line beam CWB is adjusted according to the size of the opening of the mask 58, which defines the size of the irradiation region of the line beam CWB.

As for this example, the description has been made using the example where the entire range of the irradiation region with the line beam PLB overlaps the irradiation region with the line beam CWB in the Y axis direction, which is the movement direction of the irradiation object 31. Alternatively, only some parts of the regions may overlap each other.

5.5 Modification Example 2

Figure 21A:
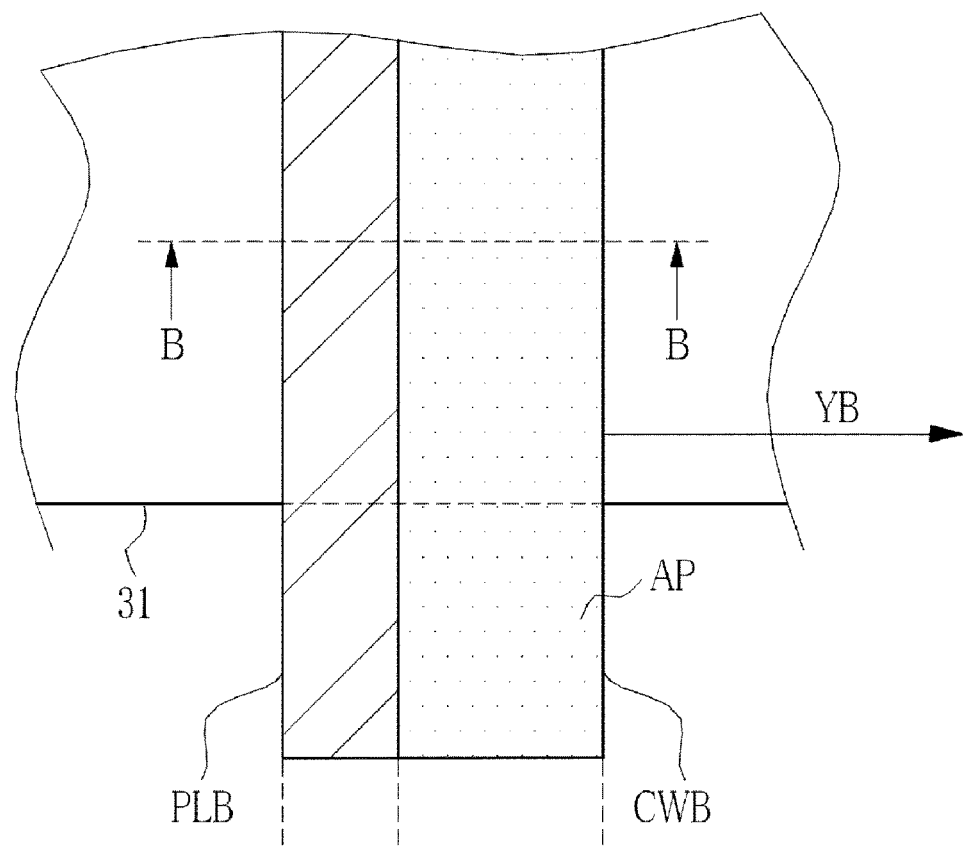
FIG. 21A illustrates an enlarged diagram of the irradiation region of the line beam.
Figure 21B:
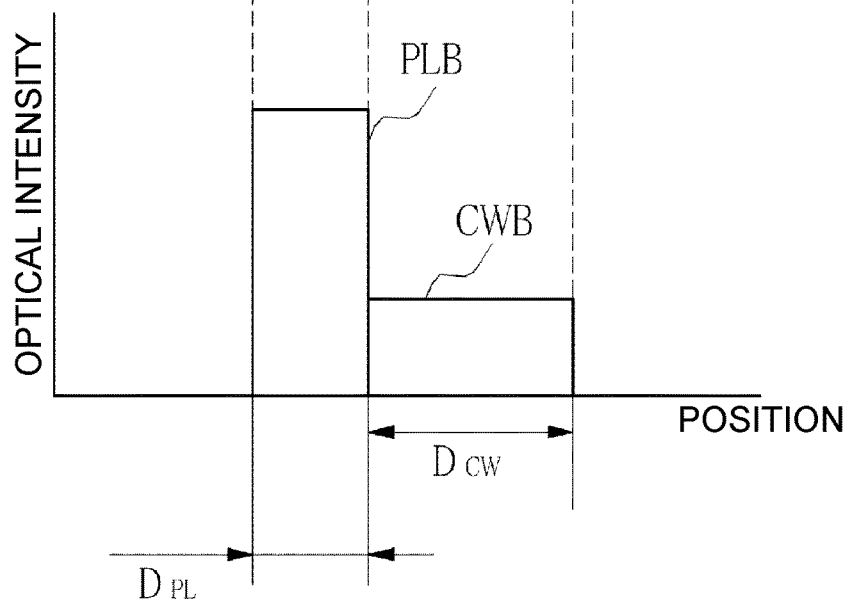
FIG. 21B illustrates the optical intensity distribution of the line beam taken along line B-B of FIG. 21A.

As illustrated in FIGS. 21A and 21B, the irradiation region of the line beam CWB and the irradiation region of the line beam PLB do not necessarily overlap each other. In this case, only preheating is performed by the line beam CWB. FIG. 21A is an enlarged diagram of the line beams CWB and PLB as in FIG. 18A. FIG. 21B illustrates the optical intensity distributions of the line beams CWB and PLB taken along line B-B.

5.6 Modification Example 3

Figure 22:
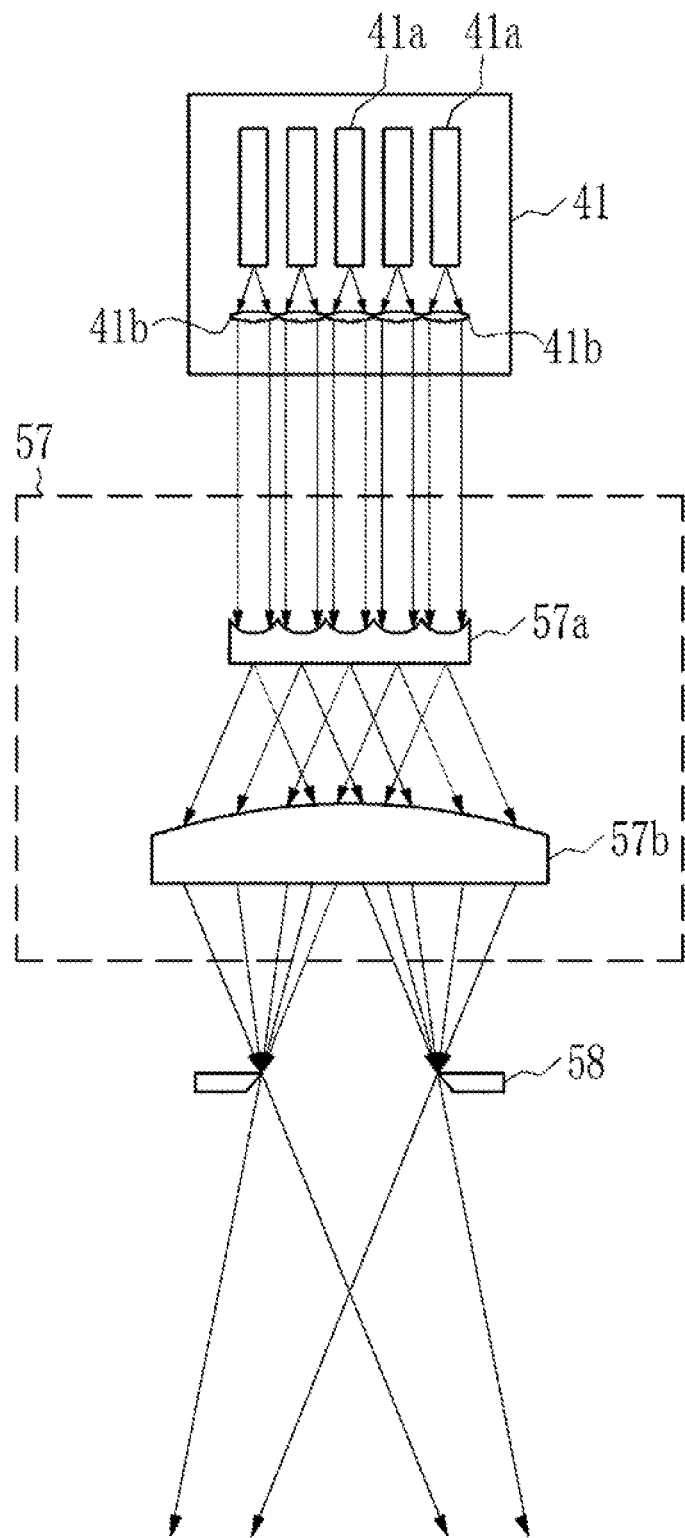
FIG. 22 illustrates a modification example of a CW laser device 41 that includes a plurality of semiconductor light sources.

FIG. 22 illustrates a modification example of the CW laser device 41. As illustrated in FIG. 22, the CW laser device 41 may include a light source unit that includes a plurality of semiconductor light sources 41a and a plurality of collimator lenses 41b. The plurality of semiconductor light sources 41a each emit CW laser light. The semiconductor light sources 41a are linearly arranged, for example. The collimator lenses 41b are provided for the respective semiconductor light sources 41a. Each collimator lens 41b is disposed so that its front focus can coincide with the emission position of the corresponding semiconductor light source 41a.

The CW laser light output from each semiconductor light source 41a is collimated by the corresponding collimator lens 41b. The collimated light emitted from each collimator lens 41b enters the fly-eye lens 57a of the second beam homogenizer 57, and the mask 58 disposed at the rear focus of the condenser optical system 57b is irradiated with this light. The collimated light with which the mask 58 is irradiated becomes Koehler illumination through the second beam homogenizer 57; the Koehler illumination has an optical intensity distribution uniformed in the sectional direction orthogonal to the optical axis.

The CW laser device 41 includes the linearly arranged semiconductor light sources 41a, and the collimator lenses 41b. The collimator lenses 41b emit CW laser light incoherent with each other. Accordingly, the CW laser light with a reduced speckle can be output.

In this example, the plurality of semiconductor light sources 41a are linearly arranged. Alternatively, the semiconductor light sources 41a may be two-dimensionally arranged to constitute a planar light source.

6. Details of Pulse Laser Device

Figure 23:
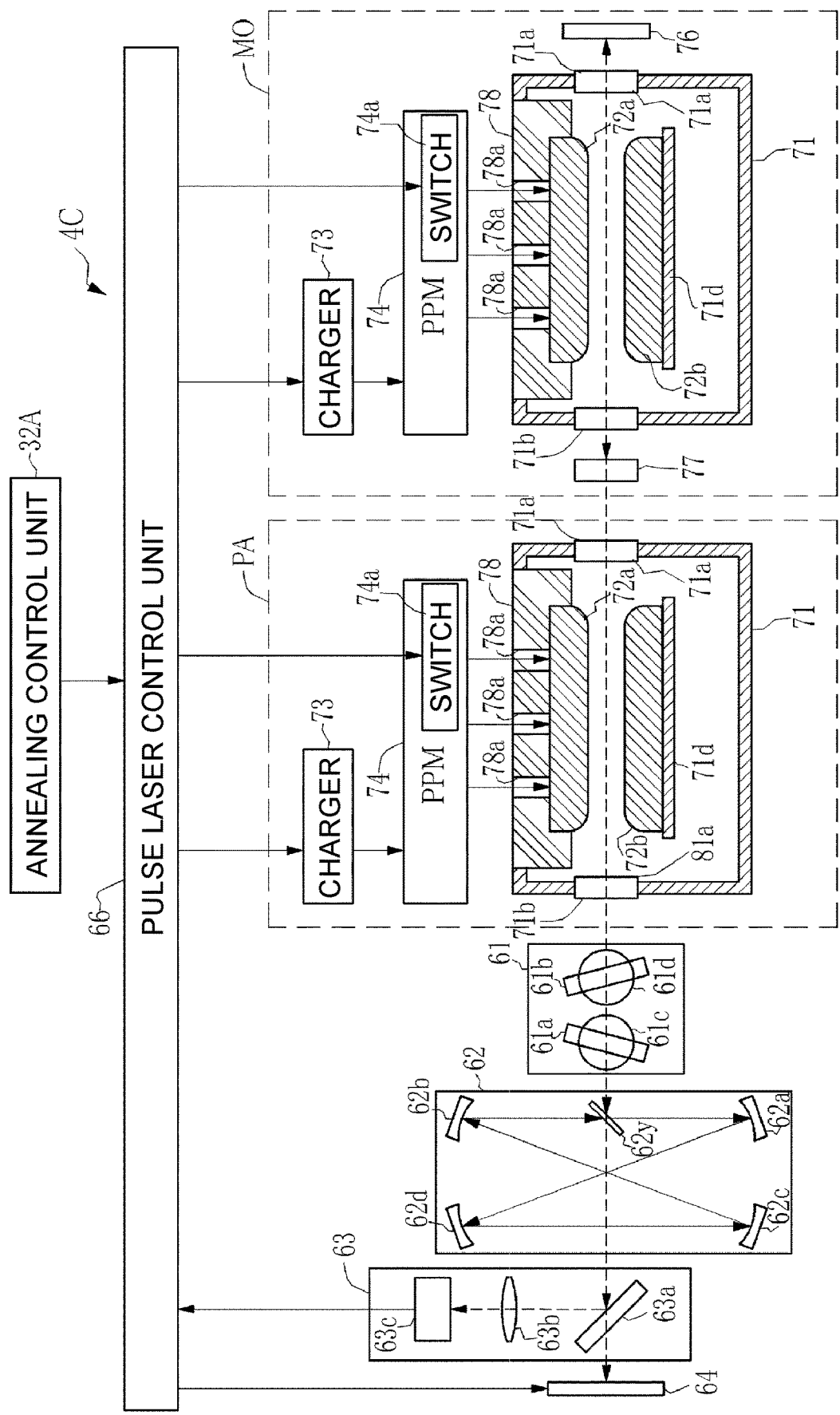
FIG. 23 illustrates a configuration example of a pulse laser device.

FIG. 23 illustrates a configuration example of the pulse laser device 3 usable in the aforementioned embodiments. The pulse laser device 3 is connected to any of the annealing control unit 32A illustrated in FIG. 4, the annealing control unit 32B illustrated in FIG. 12 and the annealing control unit 32C illustrated in FIG. 15 in conformity with the laser annealing device to be used in combination among the laser annealing devices in the aforementioned embodiments. As for this example, the description is made using an example of being connected to the annealing control unit 32A illustrated in FIG. 4.

The pulse laser device 3 includes, for example, a master oscillator MO, an amplifier PA, an attenuator 61, a pulse stretcher 62, a pulse energy measurement unit 63, a shutter 64, and a pulse laser control unit 66.

The master oscillator MO includes, for example, a laser chamber 71, a pair of electrodes 72a and 72b, a charger 73, and a pulse power module (PPM) 74. The master oscillator MO further includes a highly reflective mirror 76, and an output coupling mirror 77. FIG. 23 illustrates the internal configuration of the laser chamber 71 in view of a direction substantially perpendicular to the travel direction of the laser light.

The laser chamber 71 is a chamber in which a laser gas is enclosed; the laser gas serves as a laser medium that contains argon, krypton or xenon as rare gas, neon or helium as buffer gas, and chlorine, fluorine or the like as halogen gas, for example. The pair of electrodes 72a and 72b are disposed, in the laser chamber 71, as electrodes for exciting the laser medium by discharge. An opening is formed at the laser chamber 71. This opening is blocked with an electric insulation portion 78. The electrode 72a is supported by the electric insulation portion 78. The electrode 72b is supported by a return plane 71d. The return plane 71d is connected to the internal surface of the laser chamber 71 by wiring, not illustrated. Conductor portions 78a are embedded in the electric insulation portion 78. The conductor portions 78a apply a high voltage supplied by the pulse power module 74 to the electrode 72a.

The charger 73 may be a DC power supply device that charges a charging capacitor, not illustrated, in the pulse power module 74. The pulse power module 74 includes a switch 74a controlled by the pulse laser control unit 66, for example. When the switch 74a is turned on, the pulse power module 74 generates a pulse-shaped high voltage from an electric energy held in the charger 73, and applies the high voltage to the pair of electrodes 72a and 72b.

When the high voltage is applied between the pair of electrodes 72a and 72b, the insulation between the pair of electrodes 72a and 72b is broken to cause discharge. The discharge energy excites the laser medium in the laser chamber 71, and causes transition to a high energy level. When the excited laser medium transitions to a low energy level, this medium emits light according to the energy level difference.

Windows 71a and 71b are provided at the opposite ends of the laser chamber 71. The light caused in the laser chamber 71 is emitted to the outside of the laser chamber 71 via the windows 71a and 71b.

The highly reflective mirror 76 reflects the light emitted from the window 71a of the laser chamber 71 with a high reflectance to return the light to the laser chamber 71. The output coupling mirror 77 transmits and outputs a part of the light output through the window 71b of the laser chamber 71 while reflecting the other part and returns this part into the laser chamber 71.

Consequently, the highly reflective mirror 76 and the output coupling mirror 77 constitute an optical resonator. The light emitted from the laser chamber 71 travels to and from between the highly reflective mirror 76 and the output coupling mirror 77, and is amplified every time of passing a laser gain space between the electrodes 72a and 72b. A part of the amplified light can be output as pulse laser light through the output coupling mirror 77.

The amplifier PA is disposed on the optical path of the pulse laser light output from the output coupling mirror 77 of the master oscillator MO. As with the master oscillator MO, the amplifier PA includes a laser chamber 71, a pair of electrodes 72a and 72b, a charger 73, and a pulse power module (PPM) 74. These configuration elements may be analogous to those included in the master oscillator, respectively. The amplifier PA does not necessarily include the highly reflective mirror 76 or the output coupling mirror 77. The pulse laser light having entered the window 71a of the amplifier PA passes the laser gain space between the electrodes 72a and 72b one time and is output through the window 71b.

The attenuator 61 is disposed on the optical path of the pulse laser light output from the amplifier PA, and includes, for example, two partially reflective mirrors 61a and 61b, and rotary stages 61c and 61d for the respective partially reflective mirrors. The two partially reflective mirrors 61a and 61b are optical elements that have a transmittance changing according to the incident angle of the pulse laser light. The partially reflective mirrors 61a and 61b may be adjusted to have inclination angles by the respective rotary stages 61c and 61d so that the incident angles of the pulse laser light can coincide with each other and achieve desired transmittances. Thereby, the pulse laser light is reduced to have a desired pulse energy while passing the attenuator 61. Here, the attenuator 61 may control the transmittance on the basis of a control signal of the pulse laser control unit 66.

The pulse stretcher 62 is disposed on the optical path of the pulse laser light output from the attenuator 61. The pulse stretcher 62 includes, for example, a beam splitter 62y, and first to fourth concave mirrors 62a to 62d.

The pulse laser light output from the attenuator 61 enters a first surface of the beam splitter 62y from the right side on the drawing. Here, the beam splitter 62y is, for example, a $CaF_2$ that highly transmits the pulse laser light, and includes a film that is coated on the first surface and highly transmits the pulse laser light, and a film that is coated on a second surface opposite to the first surface and partially reflects the pulse laser light. A part of the pulse laser light having entered the beam splitter 62y from the right side on the diagram transmits through the beam splitter 62y while the other part is reflected by the second surface of the beam splitter 62y and output from the first surface.

The first to fourth concave mirrors 62a to 62d sequentially reflect the pulse laser light reflected by the beam splitter 62y, thus allowing the light to enter the second surface of the beam splitter 62y from the upper side on the diagram. The beam splitter 62y reflects at least a part of the pulse laser light having entered from the upper side on the diagram. Thereby, the pulse laser light having entered the beam splitter 62y from the right side on the diagram and transmitted through this splitter, and the pulse laser light having entered from the upper side on the diagram and been reflected are superimposed with each other. The first to fourth concave mirrors 62a to 62d have the substantially same focal lengths, and are disposed so that the first to fourth concave mirrors 62a to 62d can form a beam image on the beam splitter 62y at 1:1.

A time difference according to the optical path length of a detour optical path formed by the first to fourth concave mirrors 62a to 62d occurs between the pulse laser light having entered the beam splitter 62y from the right side on the diagram and transmitted through this splitter, and the pulse laser light having entered from the upper side on the diagram and been reflected. Thereby, the pulse stretcher 62 stretches the pulse width of the pulse laser light.

The pulse energy measurement unit 63 is disposed on the optical path of the pulse laser light having passed through the pulse stretcher 62. The pulse energy measurement unit 63 includes, for example, a beam splitter 63a, a condenser optical system 63b, and an optical sensor 63c.

The beam splitter 63a transmits the pulse laser light having passed through the pulse stretcher 62 with a high transmittance toward the shutter 64 while reflecting a part of the pulse laser light toward the condenser optical system 63b. The condenser optical system 63b condenses the light reflected by the beam splitter 63a onto a light reception surface of the optical sensor 63c. The optical sensor 63c detects the pulse energy of the pulse laser light condensed on the light reception surface, and outputs data on the detected pulse energy to the pulse laser control unit 66.

The pulse laser control unit 66 transmits and receives various signals to and from the annealing control unit 32A. For example, the pulse laser control unit 66 receives a light emission trigger signal, and data on the target pulse energy Et, from the annealing control unit 32A. The pulse laser control unit 66 transmits a setting signal of the charged voltage to the charger 73, and transmits an instruction signal of switch ON and OFF to the pulse power module 74.

The pulse laser control unit 66 may receive the data on the pulse energy from the pulse energy measurement unit 63, or control the charged voltage of the charger 73 with reference to the data on the pulse energy. The pulse energy of the pulse laser light may be controlled by controlling the charged voltage of the charger 73. The pulse laser control unit 66 may correct the timing of the light emission trigger signal according to the set charged voltage value so as to cause discharge in a predetermined constant time with respect to the light emission trigger signal.

The shutter 64 may be disposed on the optical path of the pulse laser light having transmitted the beam splitter 63a of the pulse energy measurement unit 63. The pulse laser control unit 66 may control to close the shutter 64 after start of the laser oscillation until the difference between the pulse energy received from the pulse energy measurement unit 63 and the target pulse energy Et becomes in an acceptable range. The pulse laser control unit 66 may control to open the shutter 64 when the difference between the pulse energy received from the pulse energy measurement unit 63 and the target pulse energy Et becomes in the acceptable range. The pulse laser control unit 66 may transmit a signal indicating that the light emission trigger signal for the pulse laser light becomes acceptable to the annealing control unit 32A in synchronization with an open and close signal for the shutter 64.

It should be noted that although FIG. 23 illustrates the case where the pulse laser device 3 includes the amplifier PA, the attenuator 61, and the pulse stretcher 62, the configuration is not limited thereto. Alternatively, at least one of the amplifier PA, the attenuator 61, and the pulse stretcher 62 may be negated. As described above, the pulse laser device 3 is not limited to the excimer pulse laser device, and may be a solid-state pulse laser device instead.

7. Fly-Eye Lens

Figure 24:
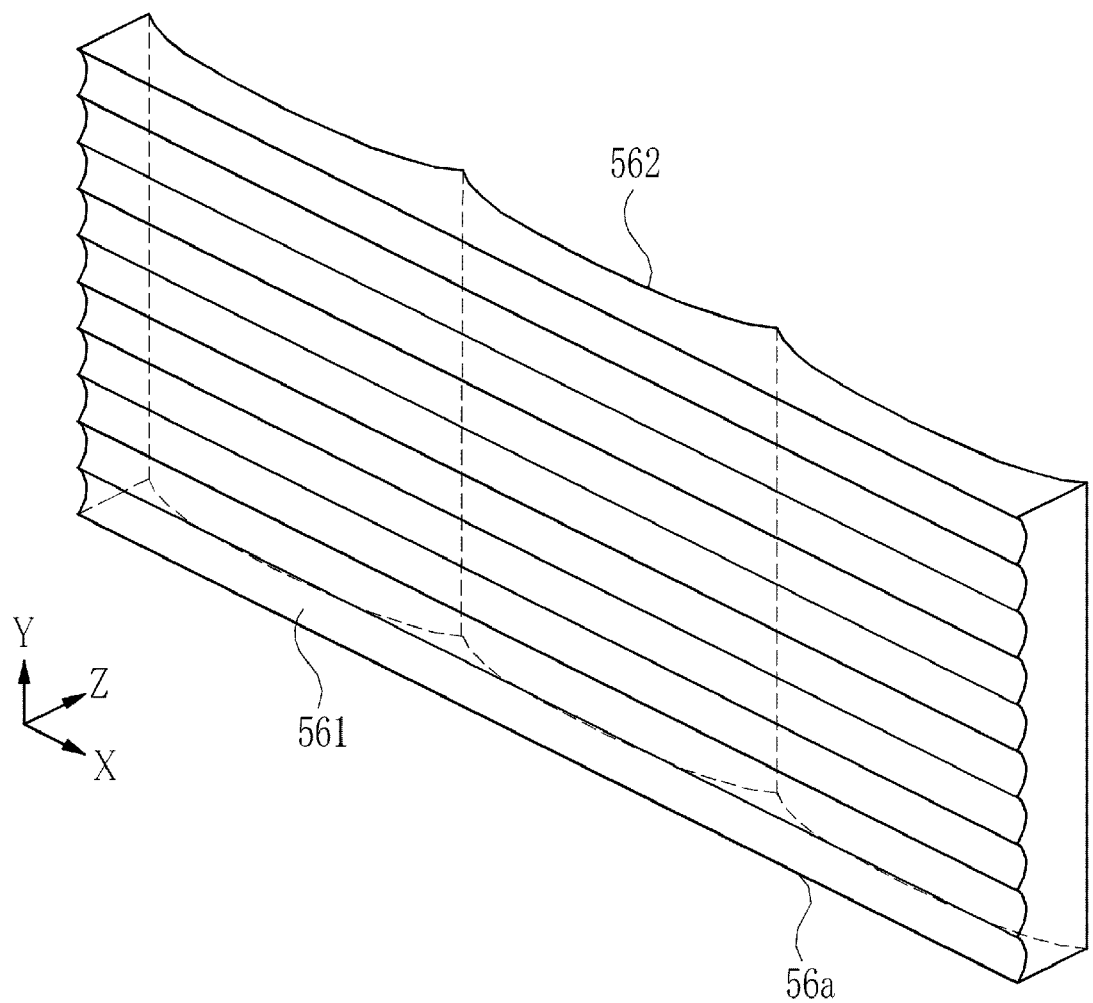
FIG. 24 illustrates a fly-eye lens.

FIG. 24 illustrates an example of the fly-eye lens 56a used in the third embodiment. The fly-eye lens 56a includes a plurality of small lenses arranged in a two-dimensional plane in the X axis direction and the Y axis direction. As for the fly-eye lens 56a, a plurality of cylindrical surfaces 561 made up of concave surfaces are arranged in the Y-direction on the first surface of the substrate that transmits ultraviolet-region light with a high transmittance. A plurality of cylindrical surfaces 562 made up of concave surfaces are arranged in the X-direction on the second surface of the substrate opposite to the first surface. The positions of the front focal planes of the cylindrical surfaces 561 substantially coincide with the positions of the front focal planes of the respective cylindrical surfaces 562. Each pair of cylindrical surfaces 561 and 562 forms one small lens. The material of the fly-eye lens 56a is, for example, synthetic quartz or $CaF_2$ crystal.

Each small lens of the fly-eye lens 56a has, for example, a rectangle shape elongated in the X axis direction, and emits a rectangular beam. As illustrated in FIG. 15, in a case of use in combination with the condenser optical system 56b, the fly-eye lens 56a functions as a planar light source where a plurality of rectangular beams are arranged on a two-dimensional plane, for the condenser optical system 56b. The beam emitted from each small lens of the fly-eye lens 56a enters the condenser optical system 56b, and is converted into a rectangular beam that has a shape similar to the shape of the beam of the corresponding small lens and has a large size.

The shape of each rectangular beam of the fly-eye lens 56a has been described as the rectangular shape elongated in the X axis direction. Alternatively, this shape may be a square, or a rectangular shape elongated in the Y axis direction. Further alternatively, this shape may be a belt shape that is a shape more similar to a line. The shape of the rectangular beam is appropriately defined in conformity with the shape or the like of the irradiation region of pulse laser light with which the irradiation object 31 is to be irradiated. The shape of the rectangular beam can be changed by changing the shape of the fly-eye lens 56a.

As for the fly-eye lens 56a in this example, the cylindrical surfaces are formed on the first surface and the second surface of one substrate. Alternatively, it is possible to adopt a fly-eye lens made by combining two substrates each having a cylindrical surface on one surface. Each cylindrical surface is not necessarily the concave surface. Alternatively, this surface may be a convex surface. Further alternatively, a Fresnel lens that has the same function as that of the cylindrical surface may be formed on the substrate.

The fly-eye lens 56a used for the pulse laser light has been described with reference to FIG. 24. The fly-eye lens 57a used for the CW laser light illustrated in FIGS. 15 and 22 is analogous to the fly-eye lens 56a.

The description provided above is intended to provide just examples without any limitations. Accordingly, it will be obvious to those skilled in the art that changes can be made to the embodiments of the present disclosure without departing from the scope of the accompanying claims.

The terms used in the present description and in the entire scope of the accompanying claims should be construed as terms "without limitations". For example, a term "including" or "included" should be construed as "not limited to that described to be included". A term "have" should be construed as "not limited to that described to be held". Moreover, a modifier "a/an" described in the present description and in the accompanying claims should be construed to mean "at least one" or "one or more".

What is claimed is:

1. A laser annealing device that anneals an irradiation object including a substrate and amorphous silicon formed on the substrate, by irradiating the irradiation object with pulse laser light caused by pulse oscillation, the laser annealing device comprising:
    a CW laser device configured to emit continuous wave laser light caused by continuous oscillation to preheat the amorphous silicon;
    a first highly reflective mirror configured to guide the continuous wave laser light to the amorphous silicon with a high reflectance and transmit visible light other than the reflected continuous wave laser light with a high transmittance;
    a pulse laser device configured to emit the pulse laser light toward the preheated amorphous silicon;
    a second highly reflective mirror configured to guide the pulse laser light to the amorphous silicon with a high reflectance, transmit visible light with a high transmittance and couple an irradiation optical path of the continuous wave laser light with an irradiation optical path of the pulse laser light; and
    a control unit configured to control an irradiation energy density of the continuous wave laser light so as to preheat the amorphous silicon to have a predetermined target temperature less than a melting point thereof, and then control at least one of a fluence and a number of pulses of the pulse laser light so as to crystallize the preheated amorphous silicon.

2. The laser annealing device according to claim 1, wherein the control unit controls the irradiation energy density by controlling at least one of an optical intensity density and an irradiation time of the continuous wave laser light.

3. The laser annealing device according to claim 1, wherein the continuous wave laser light has a central wavelength of 500 nm or shorter.

4. The laser annealing device according to claim 3, wherein the continuous wave laser light has a central wavelength of 420 nm or shorter.

5. The laser annealing device according to claim 1, wherein the irradiation energy density of the continuous wave laser light on the amorphous silicon ranges from 318 $J/cm^2$ to 6,340 $J/cm^2$.

6. The laser annealing device according to claim 5, wherein an irradiation period of the continuous wave laser light ranges from 1 sec. to 10 sec.

7. The laser annealing device according to claim 6, wherein an optical intensity density of the continuous wave laser light ranges from 318 $W/cm^2$ to 634 $W/cm^2$.

8. The laser annealing device according to claim 1, wherein the pulse laser light has a central wavelength of 365 nm or shorter.

9. The laser annealing device according to claim 1, wherein the target temperature is in a range of $1,300°C. \leq Tt < 1,414°C$.

10. The laser annealing device according to claim 1, wherein irradiation with the continuous wave laser light is continued during irradiation with the pulse laser light.

11. The laser annealing device according to claim 1, further comprising a stage configured to move the irradiation object at a constant speed with respect to irradiation positions of the continuous wave laser light and the pulse laser light output from the optical system,
    wherein the irradiation object passing the irradiation position by movement at the constant speed is irradiated with the continuous wave laser light and the pulse laser light, and
    an irradiation region of the continuous wave laser light includes a leading region residing before an irradiation region of the pulse laser light so as to allow the irradiation object passing the irradiation position to be irradiated with the continuous wave laser light before being irradiated with the pulse laser light.

12. The laser annealing device according to claim 11, wherein an entire or a part of the irradiation region of the pulse laser light overlaps the irradiation region of the continuous wave laser light in a movement direction of the irradiation object.

13. The laser annealing device according to claim 12, wherein the optical system adjusts a sectional shape orthogonal to optical axes of the continuous wave laser light and the pulse laser light to have a linear shape extending in a width direction orthogonal to the movement direction of the irradiation object.

14. The laser annealing device according to claim 1, wherein the continuous wave laser device includes a light source unit including a plurality of arranged light sources configured to output the continuous wave laser light.

15. The laser annealing device according to claim 1, further comprising a pyrometer configured to measure a temperature of the amorphous silicon and output a measurement result to the control unit, wherein
    the control unit controls an irradiation start timing of the pulse laser light based on the measurement result of the pyrometer.

16. The laser annealing device according to claim 15, wherein
the pyrometer includes a radiation pyrometer.

17. The laser annealing device according to claim 1, wherein
the CW laser device includes a semiconductor laser device.

18. The laser annealing device according to claim 1, further comprising
a shutter that is disposed on the irradiation optical path of the continuous wave laser light between the CW laser device and the second highly reflective mirror, the shutter configured to switch the continuous wave laser light between emission and non-emission.

19. The laser annealing device according to claim 1, further comprising
a pyrometer configured to measure a temperature of the amorphous silicon and output a measurement result to the control unit, wherein
the control unit controls an output of the continuous wave laser light of the CW laser device based on the measurement result of the pyrometer.

20. The laser annealing device according to claim 19, wherein
the pyrometer includes a radiation pyrometer.

21. A laser annealing device that anneals an irradiation object including a substrate and amorphous silicon formed on the substrate, by irradiating the irradiation object with pulse laser light caused by pulse oscillation, the laser annealing device comprising:
a CW laser device configured to emit continuous wave laser light caused by continuous oscillation to preheat the amorphous silicon;
a first highly reflective mirror configured to guide the continuous wave laser light to the amorphous silicon with a high reflectance and transmit visible light other than the reflected continuous wave laser light with a high transmittance;
a pulse laser device configured to emit the pulse laser light toward the preheated amorphous silicon;
a second highly reflective mirror configured to guide the pulse laser light to the amorphous silicon with a high reflectance, transmit visible light with a high transmittance and couple an irradiation optical path of the continuous wave laser light with an irradiation optical path of the pulse laser light; and
a control unit configured to control an irradiation energy density of the continuous wave laser light so as to preheat the amorphous silicon to have a predetermined target temperature less than a melting point thereof, and then stop output of the continuous wave laser light and control at least one of a fluence and a number of pulses of the pulse laser light so as to crystallize the preheated amorphous silicon.

* * * * *